US012665599B2

(12) United States Patent　(10) Patent No.: US 12,665,599 B2
Ochiai　(45) Date of Patent: Jun. 23, 2026

(54) ELECTRONIC CIRCUIT

(71) Applicant: SONY SEMICONDUCTOR SOLUTIONS CORPORATION, Kanagawa (JP)

(72) Inventor: Yasuhiro Ochiai, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 16 days.

(21) Appl. No.: 18/833,547

(22) PCT Filed: Dec. 12, 2022

(86) PCT No.: PCT/JP2022/045657
§ 371 (c)(1),
(2) Date: Jul. 26, 2024

(87) PCT Pub. No.: WO2023/149084
PCT Pub. Date: Aug. 10, 2023

(65) Prior Publication Data
US 2025/0158615 A1　May 15, 2025

(30) Foreign Application Priority Data

Feb. 3, 2022　(JP) ................................. 2022-015477

(51) Int. Cl.
*H03K 19/0185* (2006.01)
*H03K 3/037* (2006.01)
(Continued)

(52) U.S. Cl.
CPC ..... *H03K 19/018521* (2013.01); *H03K 3/037* (2013.01); *H03K 19/0013* (2013.01); *H10D 84/859* (2025.01); *H10W 20/427* (2026.01)

(58) Field of Classification Search
CPC .................. H03K 19/0013; H03K 19/018521
See application file for complete search history.

(56) References Cited

U.S. PATENT DOCUMENTS

| | | | | | |
|---|---|---|---|---|---|
| 5,561,388 | A | * | 10/1996 | Kumagai | ......... H03K 19/01806 326/18 |
| 8,878,387 | B1 | * | 11/2014 | Wong | ...................... G05F 1/613 327/540 |
| 9,712,152 | B2 | * | 7/2017 | Okamoto | ........... H03K 19/0016 |

FOREIGN PATENT DOCUMENTS

| | | | |
|---|---|---|---|
| JP | 2000-165224 | A | 6/2000 |
| JP | 2001-028423 | A | 1/2001 |

(Continued)

OTHER PUBLICATIONS

International Search Report and Written Opinion of PCT Application No. PCT/JP2022/045657, issued on Feb. 28, 2023, 08 pages of ISRWO.

*Primary Examiner* — Patrick O Neill
(74) *Attorney, Agent, or Firm* — CHIP LAW GROUP

(57) ABSTRACT

An object of the invention is to reduce reflux of an operating current of an electronic circuit provided with a plurality of transistor circuits. The electronic circuit includes a first power supply line, a second power supply line, a third power supply line, a first transistor circuit, and a second transistor circuit. A positive power supply voltage is applied to the first power supply line. A negative power supply voltage is applied to the second power supply line. An intermediate voltage between the positive power supply voltage and the negative power supply voltage is applied to the third power supply line. The first transistor circuit is connected between the first power supply line and the third power supply line. The second transistor circuit is connected between the second power supply line and the third power supply line.

13 Claims, 15 Drawing Sheets

(51) Int. Cl.
| | |
|---|---|
| *H03K 19/00* | (2006.01) |
| *H10D 84/85* | (2025.01) |
| *H10W 20/41* | (2026.01) |

(56) References Cited

FOREIGN PATENT DOCUMENTS

| | | | |
|---|---|---|---|
| JP | 2007-207998 | A | 8/2007 |
| JP | 2011-120158 | A | 6/2011 |
| JP | 2012-119024 | A | 6/2012 |

* cited by examiner

Prior Art

Prior Art

FIG. 6
Fig.6A
Prior Art
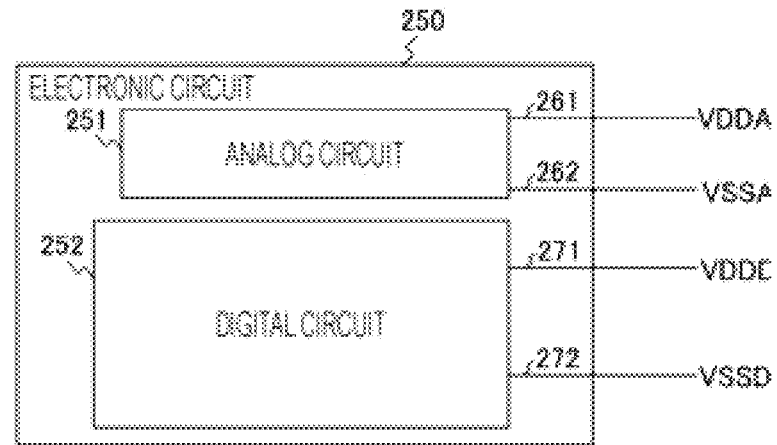
Fig. 6B
Prior Art
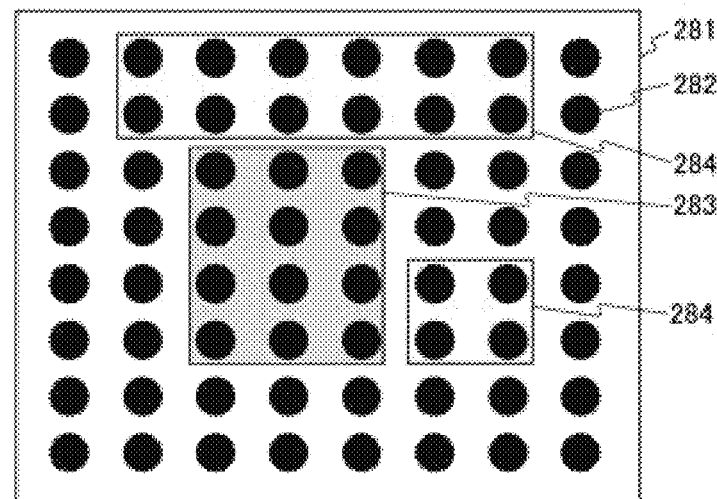
Fig. 6C
Prior Art
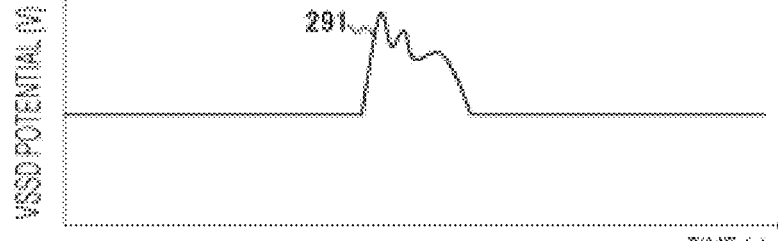

FIG. 13
Fig. 13A
Prior Art
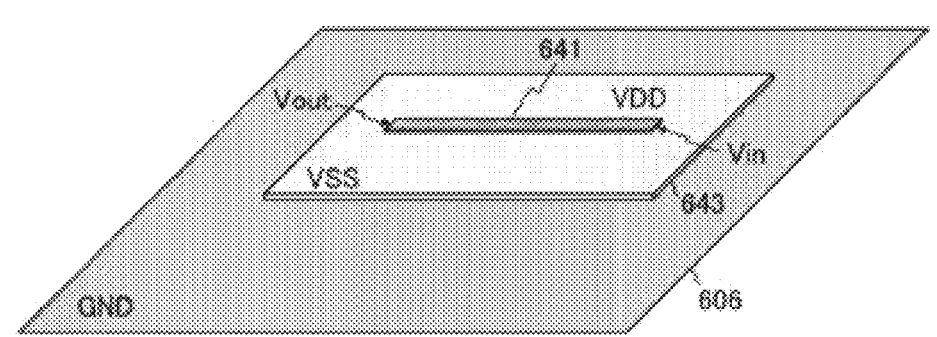
Fig. 13B
Prior Art
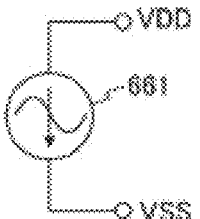
Fig. 13C
Prior Art
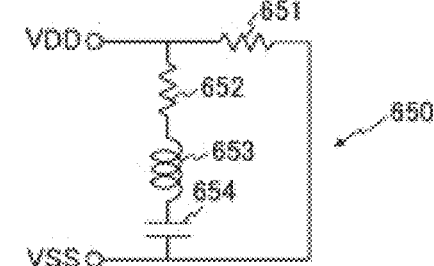

FIG. 14A
700
ELECTRONIC CIRCUIT
101 — VDDP
102 — VDDN
103 — VSSM
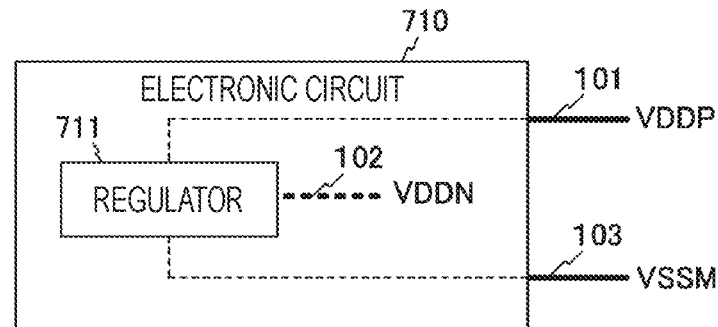
FIG. 14B
710
ELECTRONIC CIRCUIT
711
REGULATOR
101 — VDDP
102 — VDDN
103 — VSSM
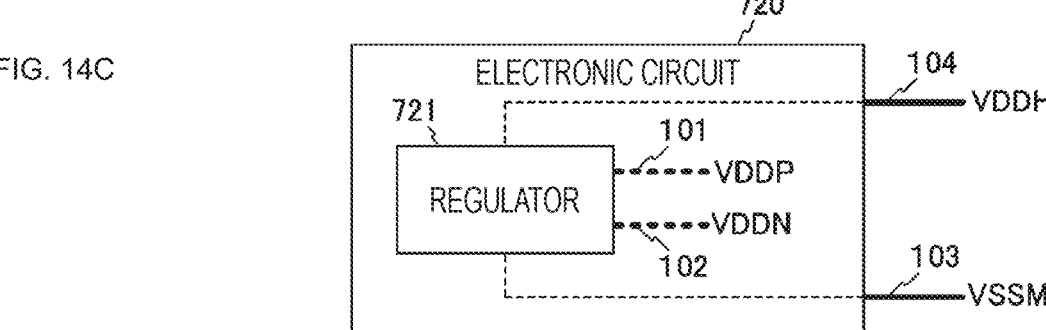
FIG. 14C
720
ELECTRONIC CIRCUIT
721
REGULATOR
104 — VDDH
101 — VDDP
102 — VDDN
103 — VSSM

101

ELECTRONIC CIRCUIT

CROSS REFERENCE TO RELATED APPLICATIONS

This application is a U.S. National Phase of International Patent Application No. PCT/JP2022/045657 filed on Dec. 12, 2022, which claims priority benefit of Japanese Patent Application No. JP 2022-015477 filed in the Japan Patent Office on Feb. 3, 2022. Each of the above-referenced applications is hereby incorporated herein by reference in its entirety.

TECHNICAL FIELD

The present technology relates to an electronic circuit. Specifically, the present technology relates to an electronic circuit using a positive power supply voltage and a negative power supply voltage.

BACKGROUND ART

In an electronic circuit provided with a transistor circuit, a voltage drop (may be referred to as an IR drop hereinafter) occurs due to the resistance of a current path of a current flowing through the transistor circuit. Increase of this IR drop decreases an operation margin of the transistor circuit, and may cause a malfunction of the transistor circuit.

Furthermore, in order to reduce the influence of mutual power supply noise between the multiplexer and the clock division circuit, a method has been proposed in which a power supply voltage of the clock division circuit and a power supply voltage of the multiplexer are generated by power supply circuits different from each other, and supplied separately (see, for example, Patent Document 1).

CITATION LIST

Patent Document

Patent Document 1: Japanese Patent Application Laid-Open No. 2012-119024

SUMMARY OF THE INVENTION

Problems to be Solved by the Invention

However, in the above-described conventional technique, in an electronic circuit provided with a plurality of transistor circuits, an operating current of a certain transistor circuit cannot be reused as an operating current of another transistor circuit. Therefore, the reflux of the operating current of the electronic circuit provided with the plurality of transistor circuits cannot be reduced, and the IR drop cannot be reduced.

The present technology has been made in view of such a situation, and an object thereof is to reduce reflux of an operating current of an electronic circuit provided with a plurality of transistor circuits.

Solutions to Problems

The present technology has been made to overcome the above-described issue, and a first aspect thereof is an electronic circuit including: a first power supply line to which a positive power supply voltage is applied; a second power supply line to which a negative power supply voltage is applied; a third power supply line to which an intermediate voltage between the positive power supply voltage and the negative power supply voltage is applied; a first transistor circuit connected between the first power supply line and the third power supply line; and a second transistor circuit connected between the second power supply line and the third power supply line. This configuration provides an effect of reducing the reflux of the operating current of the electronic circuit provided with the plurality of transistor circuits.

Furthermore, in the first aspect, the first transistor circuit may include a first parasitic capacitance between the first transistor circuit and the third power supply line, and the second transistor circuit may include a second parasitic capacitance between the second transistor circuit and the third power supply line. This configuration provides an effect that the current flowing from the first transistor circuit to the third power supply line is used as a line current.

Furthermore, in the first aspect, the first power supply line may be used as a current supply source of the first transistor circuit, the second power supply line may be used as a current discharge source of the second transistor circuit, and the third power supply line may be used as a current discharge source of the first transistor circuit and may be used as a current supply source of the second transistor circuit. This configuration provides an effect that the operating current of the first transistor circuit is reused as the operating current of the second transistor circuit.

Furthermore, in the first aspect, the intermediate voltage may be set to a ground voltage. This configuration provides an effect that the operating current discharged from the first transistor circuit is supplied as the operating current of the second transistor circuit.

Furthermore, the first aspect may further include: a P-type semiconductor substrate; a first N-well formed in the P-type semiconductor substrate and connected to the first power supply line; a second N-well formed in the P-type semiconductor substrate and connected to the third power supply line; a third N-well formed in the first N-well and connected to the first power supply line; a first P-well formed in the first N-well and connected to the third power supply line; a fourth N-well formed in the second N-well and connected to the third power supply line; and a second P-well formed in the second N-well and connected to the second power supply line, in which the first transistor circuit may include: a first P-channel field effect transistor formed in the third N-well; and a first N-channel field effect transistor formed in the first P-well, and the second transistor circuit may include: a second P-channel field effect transistor formed in the fourth N-well; and a second N-channel field effect transistor formed in the second P-well. This configuration provides an effect that the first transistor circuit and the second transistor circuit are integrated on the P-type semiconductor substrate.

Furthermore, in the first aspect, the intermediate voltage may be set to a voltage higher than a substrate voltage of the P-type semiconductor substrate. This configuration provides an effect of reducing a leakage current from the second transistor circuit in which the negative power supply voltage is used as a power supply.

Furthermore, in the first aspect, the first transistor circuit and the second transistor circuit may be buffers. This configuration provides an effect that the operating current of the first transistor circuit is reused as the operating current of the second transistor circuit while enabling multi-stage connection of the transistor circuit.

Furthermore, in the first aspect, the buffers may be multi-stage buffers. This configuration provides an effect that even when the first transistor circuit and the second transistor circuit operate asynchronously, the operating current of the first transistor circuit is reused as the operating current of the second transistor circuit.

Furthermore, in the first aspect, each of the first transistor circuit and the second transistor circuit may include a digital circuit and an analog circuit, and the electronic circuit further may include a power plane shared by the digital circuit and the analog circuit and to which the intermediate voltage is applied. This configuration provides an effect that the area occupied by the power plane to which the intermediate voltage is applied is reduced.

Furthermore, in the first aspect, an operation of the first transistor circuit and an operation of the second transistor circuit may be synchronized. This configuration provides an effect that the current discharged from the first transistor circuit to the third power supply line is supplied to the second transistor circuit.

Furthermore, in the first aspect, the electronic circuit may further include a delay circuit that brings an operation timing of the first transistor circuit and an operation timing of the second transistor circuit closer to each other. This configuration provides an effect that the operating current of the first transistor circuit is reused as the operating current of the second transistor circuit while coping with an increase in the circuit scale of the first transistor circuit and the second transistor circuit.

Furthermore, in the first aspect, the electronic circuit may further include a level shifter that shifts a level of a signal transferred between the first transistor circuit and the second transistor circuit. This configuration provides an effect that a signal is normally transferred between the first transistor circuit and the second transistor circuit.

Furthermore, in the first aspect, the electronic circuit may further include a regulator that generates the negative power supply voltage on the basis of the positive power supply voltage. This configuration provides an effect that the negative power supply voltage is generated at the supply destination of the positive power supply voltage.

Furthermore, in the first aspect, the electronic circuit may further include a substrate on which a power plane to which the intermediate voltage is applied is formed; and a fourth power supply line to which the positive power supply voltage is applied and a fifth power supply line to which the negative power supply voltage is applied, the fourth power supply line and the fifth power supply line being arranged adjacent to each other via an insulating film on the power plane. This configuration provides an effect of reducing electromagnetic interference (EMI).

BRIEF DESCRIPTION OF DRAWINGS

FIGS. 6A, 6B, and 6C are diagrams illustrating a configuration example of an electronic circuit of a comparative example used to compare the configuration of power supply lines with that of the second embodiment.

FIGS. 13A, 13B, and 13C are diagrams illustrating an example of an electromagnetic field analysis model of a comparative example used for comparing EMI with a printed circuit board used for an electronic circuit according to the sixth embodiment.

FIGS. 14A, 14B, and 14C are block diagrams illustrating a configuration example of an electronic circuit according to a seventh embodiment.

MODE FOR CARRYING OUT THE INVENTION

Hereinafter, modes for carrying out the present technology (hereinafter referred to as embodiments) will be described. The description will be given in the following order.

1. First Embodiment (an example in which a transistor circuit in which a positive power supply voltage is used as a power supply and a transistor circuit in which a negative power supply voltage is used as a power supply are provided)

2. Second Embodiment (an example in which a power plane to which an intermediate voltage between a positive power supply voltage and a negative power supply voltage of is applied is shared by an analog circuit and a digital circuit)

3. Third Embodiment (an example in which a delay circuit that brings the operation timing of a transistor circuit in which a positive power supply voltage is used as a power supply and the operation timing of a transistor circuit in which a negative power supply voltage is used as a power supply closer to each other is provided)

4. Fourth Embodiment (an example in which a transistor circuit in which a positive power supply voltage is used as a power supply and a transistor circuit in which a negative power supply voltage is used as a power supply are applied to a parallel processing circuit)

5. Fifth Embodiment (an example in which a level shifter that shifts a level of a signal transferred between a transistor circuit in which a positive power supply voltage is used as a power supply and a transistor circuit in which a negative power supply voltage is used as a power supply is provided)

6. Sixth Embodiment (an example in which a power supply line to which a positive power supply voltage is applied and a power supply line to which a negative power supply voltage is applied are arranged adjacent to and close to each other)

7. Seventh Embodiment (an example in which a regulator that generates a negative power supply voltage on the basis of a positive power supply voltage is provided)

8. Eighth Embodiment (an example in which an intermediate voltage between a positive power supply voltage and a negative power supply voltage is set to a voltage higher than the substrate voltage)

1. First Embodiment

Figure 1:
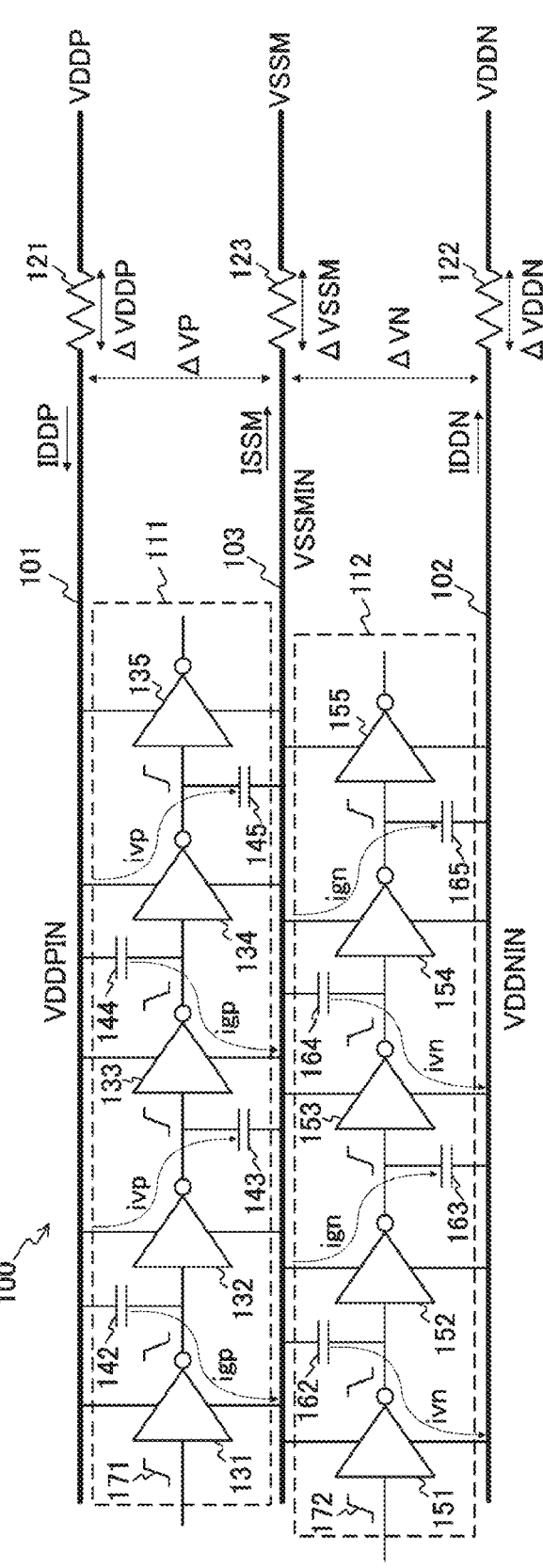
FIG. 1 is a diagram illustrating a configuration example of an electronic circuit according to the first embodiment.
Figure 2A:
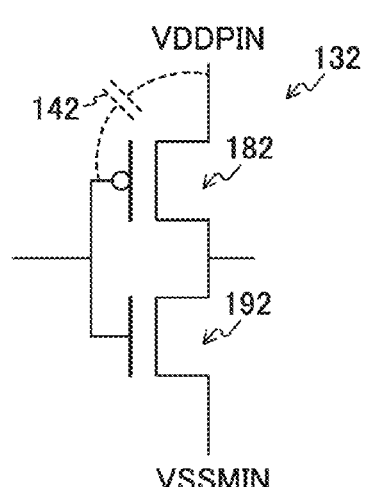
FIGS. 2A and 2B are diagrams illustrating a configuration example of an inverter used for a transistor circuit according to the first embodiment.
Figure 2B:
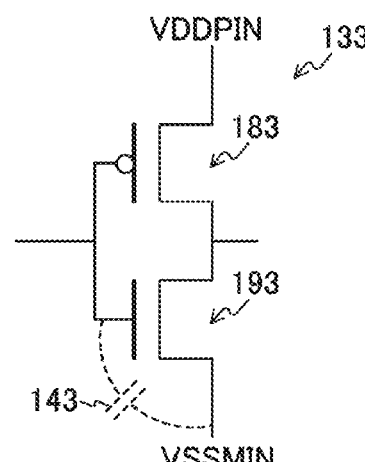

FIG. 1 is a diagram illustrating a configuration example of an electronic circuit according to a first embodiment, and FIGS. 2A and 2B are diagrams illustrating a configuration example of an inverter used for a transistor circuit according to the first embodiment. Note that FIG. 2A illustrates a circuit configuration of an inverter 132 of FIG. 1, and FIG. 2B illustrates a circuit configuration of an inverter 133 of FIG. 1.

In FIG. 1, an electronic circuit 100 includes transistor circuits 111 and 112. Each of the transistor circuits 111 and 112 can be configured as a circuit including at least one transistor. This transistor may be a field effect transistor, a bipolar transistor, or a mixture thereof. The transistor circuits 111 and 112 may be integrated on a semiconductor substrate. The semiconductor substrate may be a Si single crystal substrate or a compound semiconductor substrate of GaN, GaAs, SiC, GaInAsP, or the like.

Each of the transistor circuits 111 and 112 may include a logic circuit such as an AND gate, an OR gate, a NOT gate, a NAND gate, a NOR gate, or an ExOR gate. Furthermore, each of the transistor circuits 111 and 112 may include a flip-flop, a counter, a register, a shift register, a latch, an encoder, a decoder, a multiplexer, a demultiplexer, an adder, a comparator, a memory, or the like. Furthermore, each of the transistor circuits 111 and 112 may include a buffer, an inverter, an operational amplifier, a differential amplifier, or the like. In these circuits, the elements may be connected in cascade. For example, the buffer may be a multi-stage buffer, and the inverter may be a multi-stage inverter.

For example, as illustrated in FIG. 1, the transistor circuit 111 may include inverters 131 to 135 connected in cascade, and the transistor circuit 112 may include inverters 151 to 155 connected in cascade.

Furthermore, the electronic circuit 100 includes power supply lines 101 to 103. A positive power supply voltage VDDP is applied to the power supply line 101. A negative power supply voltage VDDN is applied to the power supply line 102. An intermediate voltage VSSM between the positive power supply voltage VDDP and the negative power supply voltage VDDN is applied to the power supply line 103. The absolute values of the power supply voltages VDDP and VDDN may be the same or different from each other. For example, the positive power supply voltage VDDP may be 1.1 V, and the negative power supply voltage VDDN may be −1.0 V. The absolute values of the power supply voltages VDDP and VDDN may deviate from each other by about 20%. The absolute value of each of the power supply voltages VDDP and VDDN may be reduced to 1.0 V or less. The intermediate voltage VSSM may be the ground voltage or a voltage higher than the ground voltage.

The transistor circuit 111 is connected between the power supply line 101 and the power supply line 103. Here, the positive power supply voltage VDDP applied to the power supply line 101 and the intermediate voltage VSSM applied to the power supply line 103 are applied to the transistor circuit 111 via resistors 121 and 123, respectively. At this time, when the transistor circuit 111 operates, currents IDDP and ISSM flow through the power supply lines 101 and 103, respectively. Therefore, at the connection point between the transistor circuit 111 and the power supply line 101, a power supply voltage VDDPIN lowered from the power supply voltage VDDP by a voltage drop ΔVDDP due to the current IDDP flowing through the resistor 121 is applied. Furthermore, at the connection point between the transistor circuit 111 and the power supply line 103, an intermediate voltage VSSMIN raised from the intermediate voltage VSSM by a voltage drop ΔVSSM due to the current ISSM flowing through the resistor 123 is applied.

Furthermore, the transistor circuit 112 is connected between the power supply line 102 and the power supply line 103. Here, the negative power supply voltage VDDN applied to the power supply line 102 and the intermediate voltage VSSM applied to the power supply line 103 are applied to the transistor circuit 112 via the resistors 122 and 123, respectively. At this time, when the transistor circuit 112 operates, currents IDDN and ISSM flow through the power supply lines 102 and 103, respectively. Therefore, at the connection point between the transistor circuit 112 and the power supply line 102, a power supply voltage VDDNIN raised from the power supply voltage VDDN by a voltage drop ΔVDDN due to the current IDDN flowing through the resistor 122 is applied. Furthermore, at the connection point between the transistor circuit 112 and the power supply line 103, an intermediate voltage VSSMIN raised from the intermediate voltage VSSM by a voltage drop ΔVSSM due to the current ISSM flowing through the resistor 123 is applied.

Note that the resistors 121 to 123 are parasitic resistances of the power supply lines 101 to 103, respectively. Furthermore, in FIG. 1, the parasitic resistance of each of the power supply lines 101 to 103 is illustrated to be concentrated as corresponding the resistors 121 and 123, but may be dispersed in the respective power supply lines 101 to 103.

Here, the power supply line 101 is used as a current supply source of the transistor circuit 111. The power supply line 102 is used as a current discharge source of the transistor circuit 112. The power supply line 103 is used as a current discharge source of the transistor circuit 111 and is also used as a current supply source of the transistor circuit 112.

Furthermore, between the inputs of the inverters 132 and 134 and the power supply line 101, capacitors 142 and 144 are connected, respectively. Between the inputs of the inverters 133 and 135 and the power supply line 103, capacitors 143 and 145 are connected, respectively. Between the inputs of the inverters 152 and 154 and the power supply line 103, capacitors 162 and 164 are connected, respectively. Between the inputs of the inverters 153 and 155 and the power supply line 102, capacitors 163 and 165 are connected, respectively. The capacitors 142 to 145 and 162 to 165 are parasitic capacitances of the inverters 132 to 135 and 152 to 155, respectively.

For example, as illustrated in FIG. 2A, the inverter 132 includes a P-channel field effect transistor 182 and an N-channel field effect transistor 192. The P-channel field effect transistor 182 and the N-channel field effect transistor 192 are connected in series to each other. Then, the power supply voltage VDDPIN is applied to the source of the P-channel field effect transistor 182, and the intermediate voltage VSSMIN is applied to the source of the N-channel field effect transistor 192. In this case, the gate-source capacitance of the P-channel field effect transistor 182 corresponds to the capacitor 142.

Furthermore, as illustrated in FIG. 2B, the inverter 133 includes a P-channel field effect transistor 183 and an N-channel field effect transistor 193. The P-channel field effect transistor 183 and the N-channel field effect transistor 193 are connected in series to each other. Then, the power supply voltage VDDPIN is applied to the source of the P-channel field effect transistor 183, and the intermediate voltage VSSMIN is applied to the source of the N-channel field effect transistor 193. In this case, the gate-source capacitance of the N-channel field effect transistor 193 corresponds to the capacitor 143.

Then, an input signal 171 is sequentially inverted by the inverters 131 to 135 and sent from the preceding stage to the subsequent stage of the inverters 131 to 135. In this case, at the rising timing of the input signal 171, a current igp flows from the capacitor 142 to the power supply line 103 via the inverter 131, and the current igp flows from the capacitor 144 to the power supply line 103 via the inverter 133. Furthermore, a current ivp flows from the power supply line 101 to the capacitor 143 via the inverter 132, and the current ivp flows from the power supply line 101 to the capacitor 145 via the inverter 134.

Furthermore, an input signal 172 is sequentially inverted by the inverters 151 to 155, and sent from the preceding stage to the subsequent stage of the inverters 151 to 155. In this case, at the rising timing of the input signal 172, a current ivn flows from the capacitor 162 to the power supply line 102 via the inverter 151, and the current ivn flows from the capacitor 164 to the power supply line 102 via the inverter 153. Furthermore, a current ign flows from the power supply line 103 to the capacitor 163 via the inverter 152, and a current ign flows from the power supply line 103 to the capacitor 165 via the inverter 154.

Here, it is assumed that the current igp and the current ign are equal. In this case, synchronization of the input signal 171 and the input signal 172 can regenerate the current igp flowing from the transistor circuit 111 to the power supply line 103 as a regenerative current and reused as the current ign flowing from the power supply line 103 to the transistor circuit 112.

This reuse can make the current ISSM flowing through the power supply line 103 0. Here, the resistance value of each of the resistors 121 and 122 is defined as Rv, and it is assumed that the relationship ivp=ivn=iv is held. In this case, the voltage drop ΔVDDP of each of the resistors 121 and 122 is iv×Rv, and the voltage drop ΔVSSM of the resistor 123 is 0. As a result, an IR drop ΔVP between the power supply line 101 and the power supply line 103 is expressed by the following formula.

$$\Delta VP = \Delta VDDP + \Delta VSSM = iv \times Rv$$

Furthermore, an IR drop ΔVN between the power supply line 102 and the power supply line 103 is expressed by the following formula.

$$\Delta VN = \Delta VDDN + \Delta VSSM = iv \times Rv.$$

Figure 3:
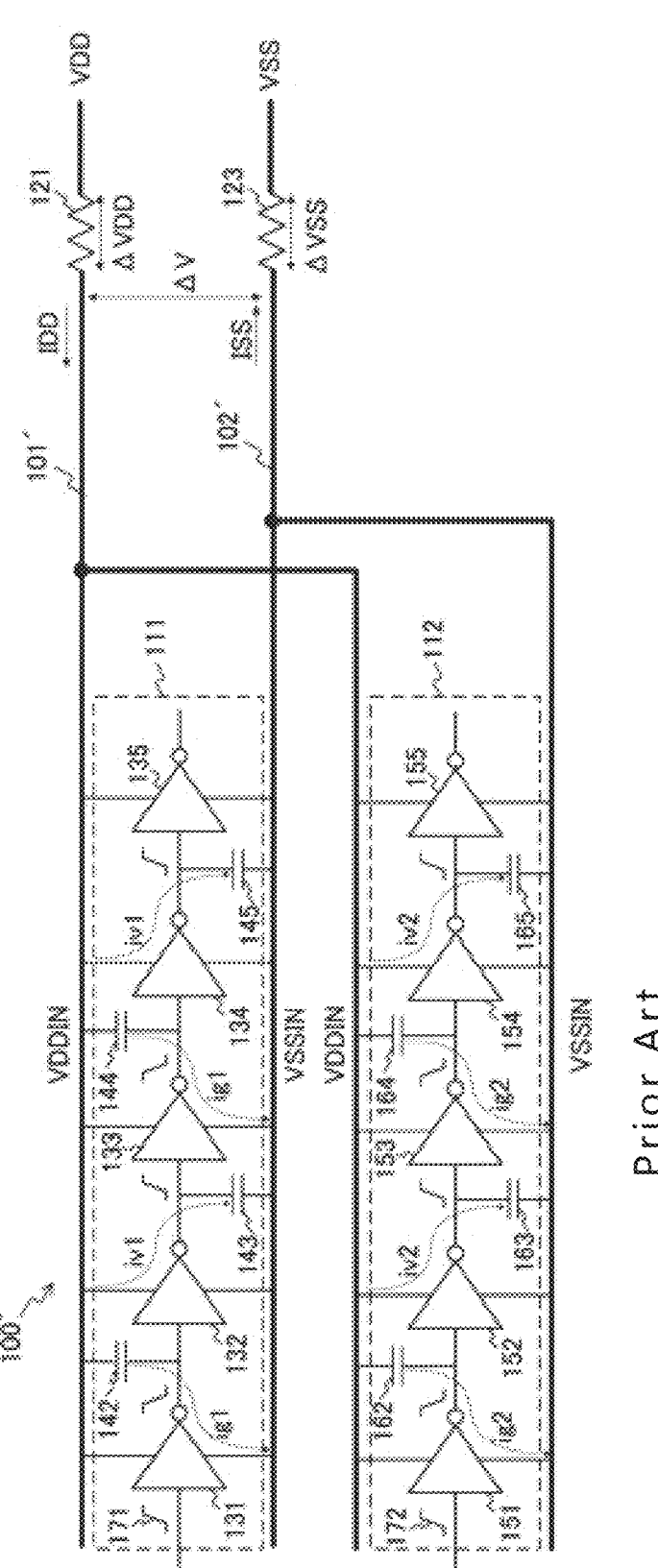
FIG. 3 is a diagram illustrating a configuration example of an electronic circuit of a first comparative example used for comparison of the IR drop with the first embodiment.

FIG. 3 is a diagram illustrating a configuration example of an electronic circuit of a first comparative example used for comparison of the IR drop with the first embodiment.

In the figure, an electronic circuit 100' includes power supply lines 101' and 102' instead of the power supply lines

101 to 103 of the first embodiment described above. Other than the power supply lines, components of the electronic circuit 100' of the first comparative example are similar to those of the electronic circuit 100 of the first embodiment described above.

A positive power supply voltage VDD is applied to the power supply line 101'. A ground voltage VSS is applied to the power supply line 102'. Each of the power supply lines 101' and 102' may be branched.

Each of the transistor circuits 111 and 112 is connected between the power supply line 101' and the power supply line 102'. Here, the positive power supply voltage VDD applied to the power supply line 101' and the ground voltage VSS applied to the power supply line 102' are applied to the transistor circuits 111 and 112 via the resistors 121 and 123, respectively. In this case, when the transistor circuits 111 and 112 operate, currents IDD and ISS flow through the power supply lines 101' and 102', respectively. Therefore, at the connection point between each of the transistor circuits 111 and 112 and the power supply line 101', a power supply voltage VDDIN lowered from the power supply voltage VDD by a voltage drop ΔVDD due to the current IDD flowing through the resistor 121 is applied. Furthermore, at the connection point between each of the transistor circuits 111 and 112 and the power supply line 102', a power supply voltage VSSIN raised from the ground voltage VSS by the voltage drop ΔVDD due to a current ISS flowing through the resistor 123 is applied.

Then, the input signal 171 is sequentially inverted by the inverters 131 to 135 and sent from the preceding stage to the subsequent stage of the inverters 131 to 135. In this case, at the rising timing of the input signal 171, a current ig1 flows from the capacitor 142 to the power supply line 102' via the inverter 131, and the current ig1 flows from the capacitor 144 to the power supply line 102' via the inverter 133. Furthermore, a current iv1 flows from the power supply line 101' to the capacitor 143 via the inverter 132, and the current iv1 flows from the power supply line 101' to the capacitor 145 via the inverter 134.

Furthermore, the input signal 172 is sequentially inverted by the inverters 151 to 155, and sent from the preceding stage to the subsequent stage of the inverters 151 to 155. In this case, at the rising timing of the input signal 172, a current ig2 flows from the capacitor 162 to the power supply line 102' via the inverter 151, and the current ig2 flows from the capacitor 164 to the power supply line 102' via the inverter 153. Furthermore, the current iv2 flows from the power supply line 101' to the capacitor 163 via the inverter 152, and the current iv2 flows from the power supply line 101' to the capacitor 165 via the inverter 154.

At this time, assuming that iv1=iv2=iv is held, the voltage drop ΔVDD by the resistor 121 is expressed as 2×iv×Rv. Furthermore, assuming that Rg=Rv is held, where the resistance value of the resistor 123 is defined as Rg, and that ig1=ig2=ig is held, a voltage drop ΔVSS of the resistor 123 is expressed by 2×ig×Rv. At this point, in a case where it is assumed that ig=iv is held, the IR drop ΔV between the power supply line 101' and power supply line 102' is expressed by the following formula.

$$\Delta V = \Delta VDD + \Delta VSS = 4 \times iv \times Rv$$

Therefore, it can be seen that the IR drop ΔV by the electronic circuit 100' of the above-described first comparative example is four times as large as each of the IR drops ΔVP and ΔVN of the electronic circuit 100 of the first embodiment described above.

Figure 4:
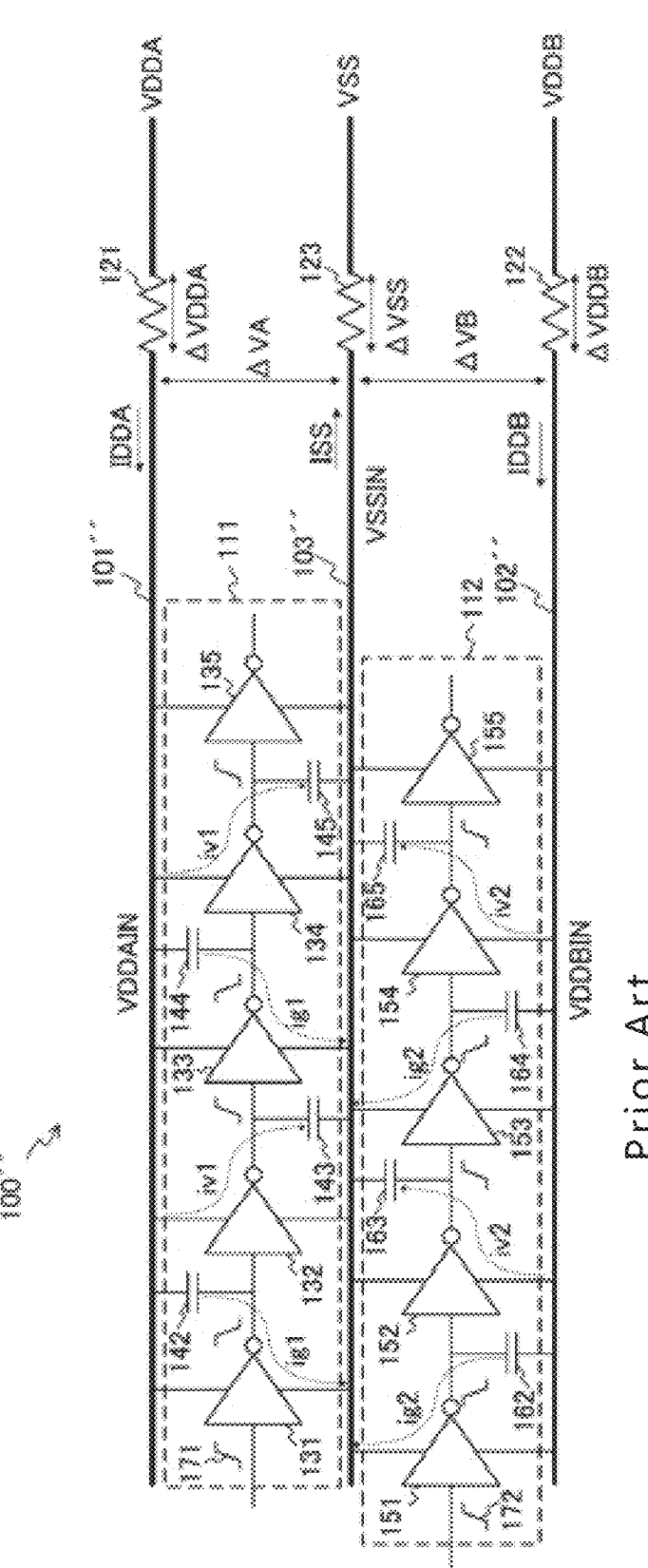
FIG. 4 is a diagram illustrating a configuration example of an electronic circuit of a second comparative example used for comparison of the IR drop with the first embodiment.

FIG. 4 is a diagram illustrating a configuration example of an electronic circuit of a second comparative example used for comparison of the IR drop with the first embodiment.

In the figure, an electronic circuit 100" includes power supply lines 101" to 103" instead of the power supply lines 101 to 103 of the first embodiment described above. Other than the power supply lines, components of the electronic circuit 100" of the second comparative example are similar to the components of the electronic circuit 100 of the first embodiment described above.

A positive power supply voltage VDDA is applied to the power supply line 101". A positive power supply voltage VDDB is applied to the power supply line 102". The ground voltage VSS is applied to the power supply line 103".

The transistor circuit 111 is connected between the power supply line 101" and the power supply line 103". Here, the positive power supply voltage VDDA applied to the power supply line 101" and the ground voltage VSS applied to the power supply line 103" are applied to the transistor circuit 111 via the resistors 121 and 123, respectively. In this case, when the transistor circuit 111 operates, currents IDDA and ISS flow through the power supply lines 101" and 103", respectively. Therefore, at the connection point between the transistor circuit 111 and the power supply line 101", a power supply voltage VDDAIN lowered from the power supply voltage VDDA by a voltage drop ΔVDDA due to the current IDDA flowing through the resistor 121 is applied. Furthermore, at the connection point between the transistor circuit 111 and the power supply line 103", the power supply voltage VSSIN raised from the ground voltage VSS by the voltage drop ΔVSS due to the current ISS flowing through the resistor 123 is applied.

Furthermore, the transistor circuit 112 is connected between the power supply line 102" and the power supply line 103". Here, the positive power supply voltage VDDB applied to the power supply line 102" and the ground voltage VSS applied to the power supply line 103" are applied to the transistor circuit 112 via the resistors 122 and 123, respectively. In this case, when the transistor circuit 112 operates, currents IDDB and ISS flow through the power supply lines 102" and 103", respectively. Therefore, at the connection point between the transistor circuit 112 and the power supply line 102", a power supply voltage VDDBIN lowered from the power supply voltage VDDB by a voltage drop ΔVDDB due to the current IDDB flowing through the resistor 122 is applied. Furthermore, at the connection point between the transistor circuit 112 and the power supply line 103", the power supply voltage VSSIN raised from the ground voltage VSS by the voltage drop ΔVSS due to the current ISS flowing through the resistor 123 is applied.

Then, the input signal 171 is sequentially inverted by the inverters 131 to 135 and sent from the preceding stage to the subsequent stage of the inverters 131 to 135. In this case, at the rising timing of the input signal 171, a current ig1 flows from the capacitor 142 to the power supply line 103" via the inverter 131, and the current ig1 flows from the capacitor 144 to the power supply line 103" via the inverter 133. Furthermore, a current iv1 flows from the power supply line 101" to the capacitor 143 via the inverter 132, and the current iv1 flows from the power supply line 101" to capacitor 145 via the inverter 134.

Furthermore, the input signal 172 is sequentially inverted by the inverters 151 to 155, and sent from the preceding stage to the subsequent stage of the inverters 151 to 155. In this case, at the rising timing of the input signal 172, a current ig2 flows from the capacitor 162 to the power supply line 103" via the inverter 151, and the current ig2 flows from the capacitor 164 to the power supply line 103" via the inverter 153. Furthermore, the current iv2 flows from the power supply line 102" to the capacitor 163 via the inverter 152, and the current iv2 flows from the power supply line 102" to the capacitor 165 via the inverter 154.

In this case, the voltage drop ΔVDDA of the resistor 121 is iv×Rv, the voltage drop ΔVDDB of the resistor 122 is iv×Rv, and the voltage drop ΔVSS of the resistor 123 is 2×iv×Rv. As a result, an IR drop ΔVA between the power supply line 101" and the power supply line 102" is expressed by the following formula.

$$\Delta VA = \Delta VDDA + \Delta VSS = 3 \times iv \times Rv$$

Furthermore, an IR drop ΔVB between the power supply line 101" and the power supply line 102" is expressed by the following formula.

$$\Delta VB = \Delta VDDB + \Delta VSS = 3 \times iv \times Rv$$

Therefore, it can be seen that the IR drops ΔVA and ΔVB of the electronic circuit 100" of the second comparative example described above are three times as large as the IR drops ΔVP and ΔVN of the electronic circuit 100 of the first embodiment described above, respectively.

As described above, in the first embodiment described above, the operating current of the transistor circuit 111 can be reused as the operating current of the transistor circuit 112, and the reflux of the current flowing through the electronic circuit 100 provided with the plurality of transistors can be reduced. Therefore, it is possible to reduce the IR drops ΔVP and ΔVN caused by the resistors 121 to 123 of the power supply lines 101 to 103, respectively, and it is possible to suppress a decrease in the operation margin of each of the transistor circuits 111 and 112.

Furthermore, in the first embodiment described above, use of the positive power supply voltage VDDP and the negative power supply voltage VDDN can reduce the operating current as compared with the case of using the positive power supply voltage VDDP, and can reduce the power consumption. For example, in the electronic circuit 100 of the first embodiment described above, the operating current can be reduced to ½ as compared with the electronic circuit 100' of the first comparative example described above, and the power consumption can also be reduced to ½. Therefore, in a battery-driven electronic device on which the electronic circuit 100 is mounted, the life of the battery can be extended as compared with a battery-driven electronic device on which the electronic circuit 100' is mounted.

Note that, in the first embodiment described above, an example in which the input signal 171 and the input signal 172 are synchronized has been described, but the input signal 171 and the input signal 172 do not necessarily be synchronized. Even if the input signal 171 and the input signal 172 are not synchronized with each other, a part of the current igp flowing from the power supply line 101 to the power supply line 103 can be reused as a part of the current ign flowing from the power supply line 103 to the power supply line 102. Therefore, as compared with the above-described comparative example, the current ISSM flowing through the power supply line 103 can be reduced, and the IR drops ΔVP and ΔVN can be reduced.

2. Second Embodiment

In the first embodiment described above, the transistor circuit 111 in which the positive power supply voltage VDDP is used as a power supply and the transistor circuit 112 in which the negative power supply voltage VDDN is used as a power supply are provided. In this second embodiment, a power plane to which an intermediate voltage between the positive power supply voltage and the negative power supply voltage is applied is shared by an analog circuit and a digital circuit.

Figure 5A:
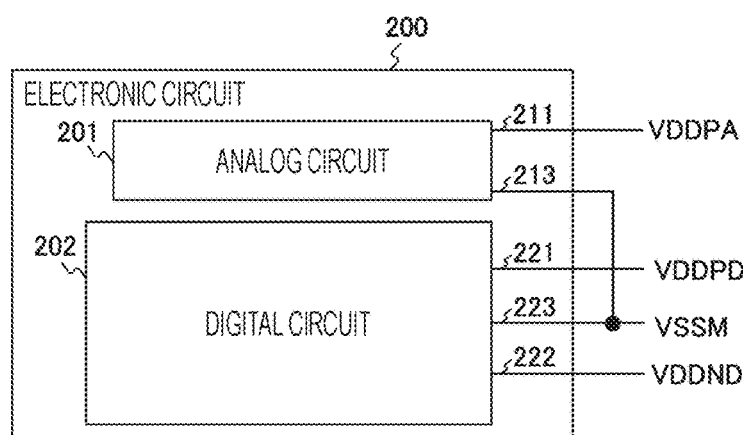
FIGS. 5A, 5B, and 5C are diagrams illustrating a configuration example of an electronic circuit according to a second embodiment.
Figure 5B:
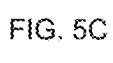
Figure 5C:
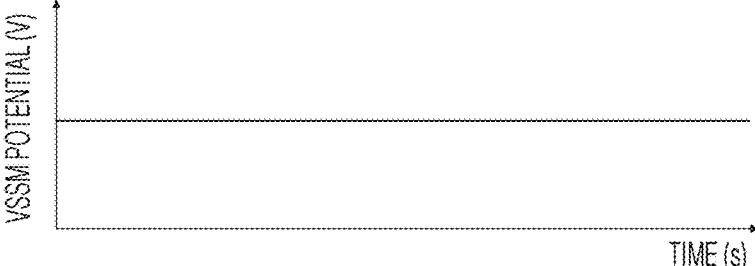

FIGS. 5A, 5B, and 5C are diagrams illustrating a configuration example of an electronic circuit according to a second embodiment. Note that FIG. 5A is a block diagram illustrating a configuration example of an electronic circuit 200, FIG. 5B is a back view illustrating the configuration example of the electronic circuit 200, and FIG. 5C is a diagram illustrating an example of a change in the VSSM potential during operation of a digital circuit 202.

In FIG. 5A, the electronic circuit 200 includes an analog circuit 201 and a digital circuit 202. The analog circuit 201 includes a power supply line 211 to which a positive power supply voltage VDDPA is applied, a power supply line 212 to which a negative power supply voltage VDDNA is applied, and a power supply line 213 to which the intermediate voltage VSSM between the positive power supply voltage VDDPA and the negative power supply voltage VDDNA is applied. Furthermore, a first transistor circuit is connected between power supply line 211 and the power supply line 213, and a second transistor circuit is connected between the power supply line 212 and the power supply line 213.

The digital circuit 202 includes a power supply line 221 to which a positive power supply voltage VDDPD is applied, a power supply line 222 to which a negative power supply voltage VDDND is applied, and a power supply line 223 to which the intermediate voltage VSSM between a positive power supply voltage VDDPD and the negative power supply voltage VDDND is applied. Here, the power supply lines 213 and 223 to which the intermediate voltage VSSM is applied can be shared by the analog circuit 201 and the digital circuit 202. Furthermore, a third transistor circuit is connected between the power supply line 221 and the power supply line 223, and a fourth transistor circuit is connected between the power supply line 222 and the power supply line 223.

Each of the first to fourth transistor circuits can be configured as a circuit including at least one transistor. For example, the third transistor circuit may be configured similarly to the transistor circuit 111 of the first embodiment described above, and the fourth transistor circuit may be configured similarly to the transistor circuit 112 of the first embodiment described above.

A semiconductor chip on which the electronic circuit 200 is formed can be implemented in a package 231 in FIG. 5B. The package 231 is provided with a power plane 233 to which the intermediate voltage VSSM is applied. The power plane 233 is connected to the power supply lines 213 and 223. In this case, the power plane 233 can be shared by the analog circuit 201 and the digital circuit 202. Furthermore, the package 231 is provided with an external terminal 232. The external terminal 232 may be a solder ball, a bump electrode, or a pillar electrode.

Here, in the digital circuit 202, the positive power supply voltage VDDPD, the negative power supply voltage VDDND, and the intermediate voltage VSSM are used to supply power to a transistor circuit including a plurality of transistors. Therefore, it is possible to reduce the reflux of the current flowing through the digital circuit 202, and as illustrated in FIG. 5C, the fluctuation of the VSSM potential during the operation of the digital circuit 202 is suppressed.

Therefore, even when the power plane 233 is shared by the analog circuit 201 and the digital circuit 202, the operation of the digital circuit 202 can be prevented from causing a malfunction of the analog circuit 201.

FIGS. 6A, 6B, and 6C are diagrams illustrating a configuration example of an electronic circuit of a comparative example used to compare the configuration of power supply lines with that of the second embodiment. Note that FIG. 6A is a block diagram illustrating a configuration example of an electronic circuit 250 of the comparative example, FIG. 6B is a back view illustrating the configuration example of the electronic circuit 250 of the comparative example, and FIG. 6C is a diagram illustrating an example of a change in a VSSD potential during operation of a digital circuit 252 of the comparative example.

In the figure, the electronic circuit 250 includes an analog circuit 251 and the digital circuit 252. The analog circuit 251 includes a power supply line 261 to which a positive power supply voltage VDDA is applied and a power supply line 262 to which a ground voltage VSSA is applied. The digital circuit 252 includes a power supply line 271 to which a positive power supply voltage VDDD is applied and a power supply line 272 to which a ground voltage VSSD is applied.

A semiconductor chip on which the electronic circuit 250 is formed can be implemented in a package 281 in FIG. 6B. The package 281 is provided with a power plane 283 to which the ground voltage VSSA is applied and a power plane 284 to which the ground voltage VSSD is applied. The power plane 283 is connected to the power supply line 262, and the power plane 284 is connected to the power supply line 272. Furthermore, the package 281 is provided with an external terminal 282.

Here, as illustrated in FIG. 6C, switching noise occurs during operation of the digital circuit 252, and a fluctuation 291 of the VSSD potential occurs. Therefore, in order to prevent the operation of the digital circuit 252 from causing a malfunction of the analog circuit 251, the power plane 283 of the analog circuit 251 and the power plane 284 of the digital circuit 252 are separately provided.

As described above, in the second embodiment described above, in the electronic circuit 200, the power supply line 213 to which the intermediate voltage VSSM is applied is shared by the analog circuit 201 and the digital circuit 202. As a result, it is possible to achieve space saving of the power supply line 213 in the semiconductor chip on which the electronic circuit 200 is formed.

Furthermore, in the package 231, the power plane 233 to which the intermediate voltage VSSM is applied is shared by the analog circuit 201 and the digital circuit 202. As a result, it is possible to reduce the area occupied by the power plane 283 and the number of external terminals 232 as compared with a case where the power plane 233 for the analog circuit 251 and the power plane 284 for the digital circuit 252 are provided separately. Furthermore, in a printed circuit board on which the package 231 is implemented, it is possible to reduce the space for separately supplying the intermediate voltage VSSM and the area of the wiring for supplying the intermediate voltage VSSM exclusively for the analog circuit.

3. Third Embodiment

In the first embodiment described above, in order to suppress the reflux of the current flowing through the electronic circuit 100, the input signal 171 input to the transistor circuit 111 and the input signal 172 input to the transistor circuit 112 are synchronized. In this third embodiment, in order to suppress the reflux of the current flowing through the electronic circuit, a delay circuit is provided that brings the operation timing of the transistor circuit using the positive power supply voltage and the operation timing of the transistor circuit using the negative power supply voltage closer to each other.

Figure 7:
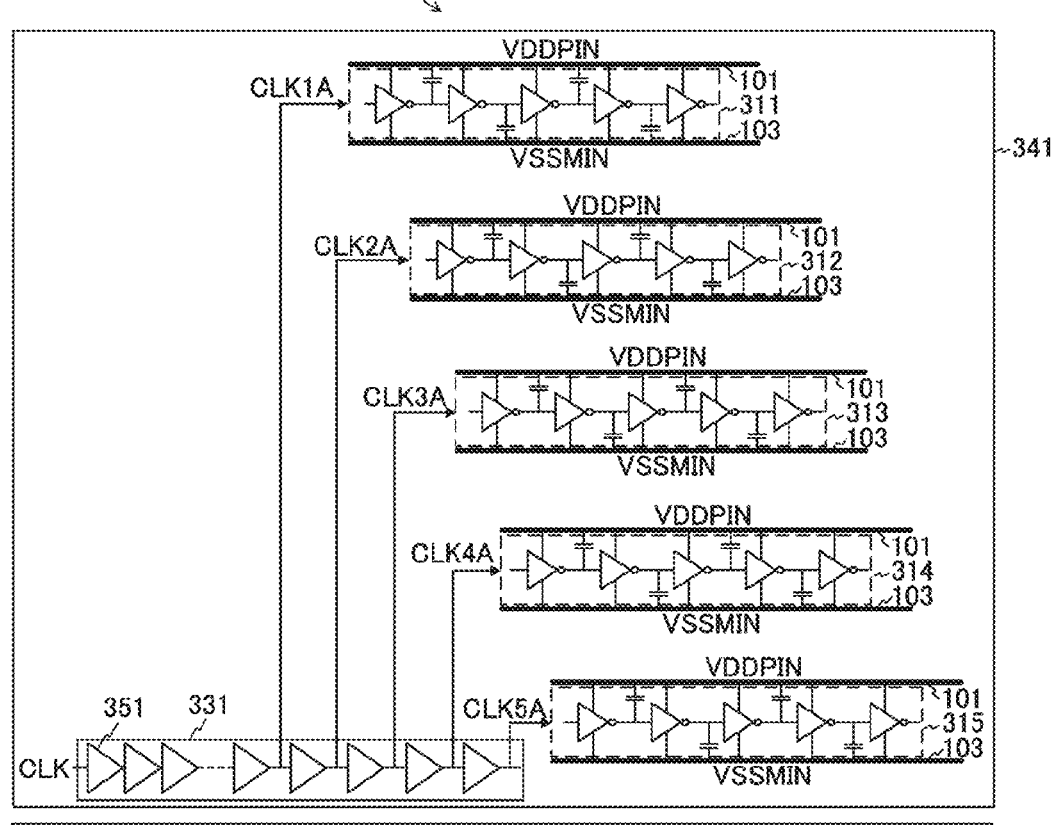
FIG. 7 is a diagram illustrating a configuration example of an electronic circuit according to a third embodiment.
Figure 7:
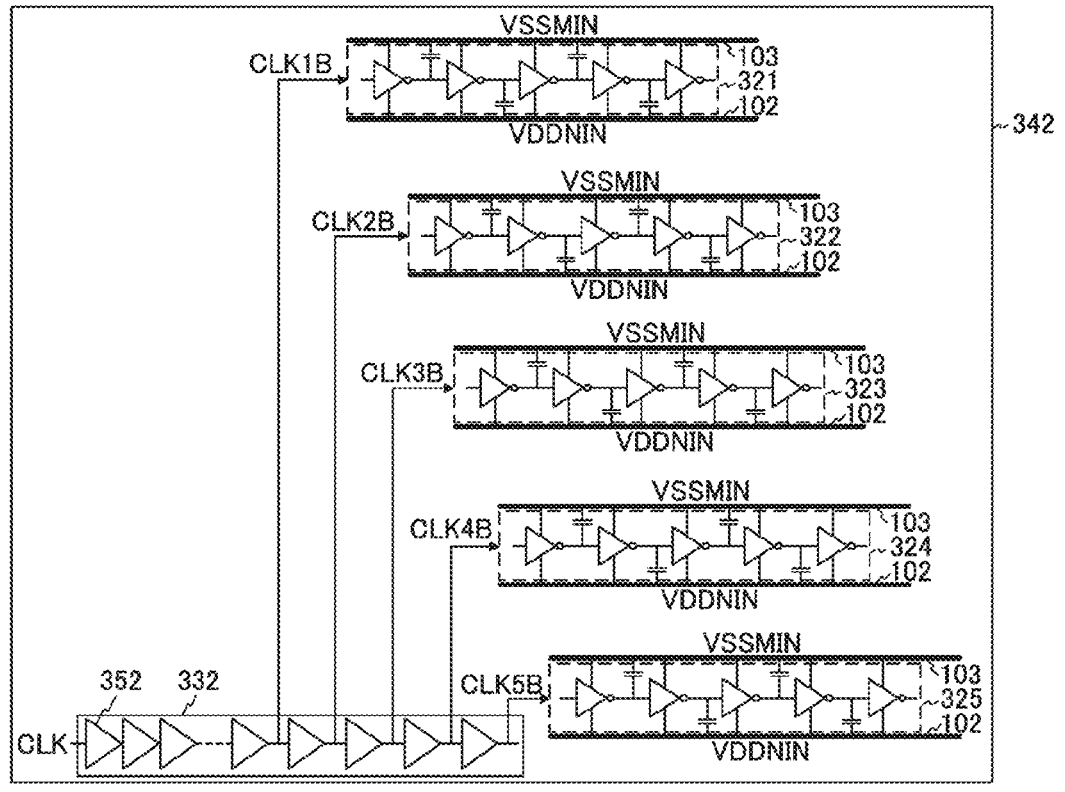
Figure 8:
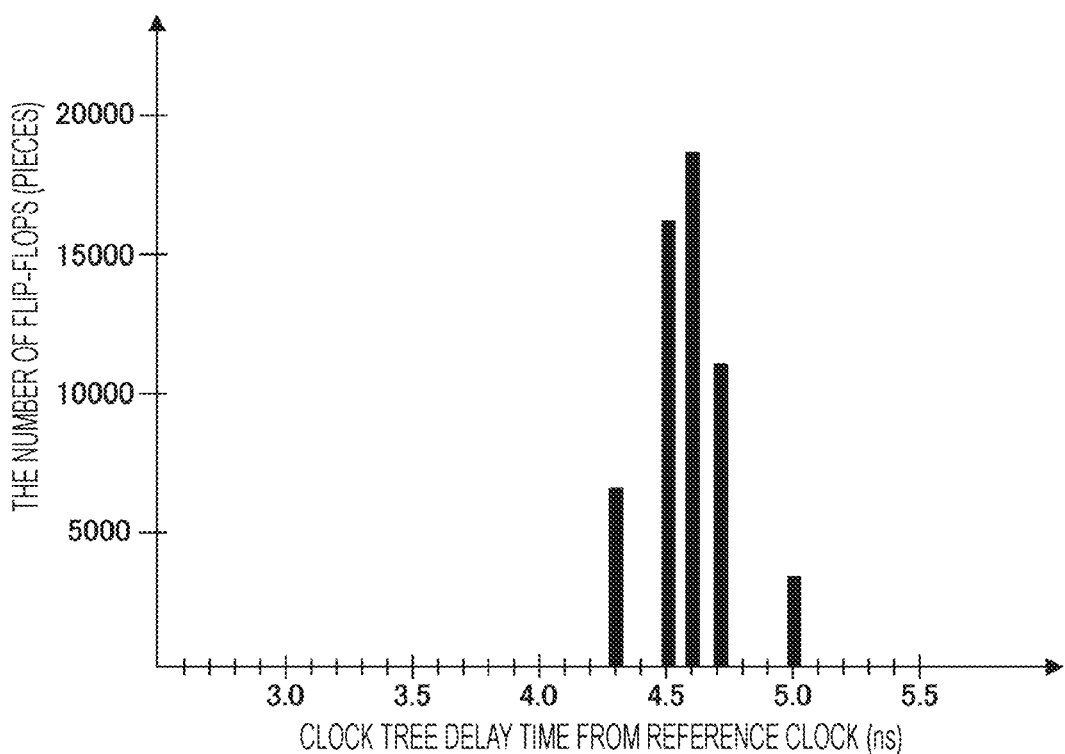
FIG. 8 is a diagram illustrating a relationship between a clock tree delay time and the number of flip-flops according to the third embodiment.

FIG. 7 is a diagram illustrating a configuration example of an electronic circuit according to the third embodiment, and FIG. 8 is a diagram illustrating a relationship between a clock tree delay time and the number of flip-flops according to the third embodiment.

In FIG. 7, an electronic circuit 300 includes circuit blocks 341 and 342. Note that the configurations of the circuit blocks 341 and 342 may be different from each other.

The circuit block 341 includes power supply lines 101 and 103. Furthermore, the circuit block 341 includes transistor circuits 311 to 315 and a delay circuit 331. Each of the transistor circuits 311 to 315 includes a clock terminal and to the clock terminals to which corresponding one of synchronization clocks CLK1A to CLK5A is input. The transistor circuits 311 to 315 are connected between the power supply line 101 and the power supply line 103. Each of the transistor circuits 311 to 315 may include a flip-flop that operates in accordance with corresponding one of the synchronization clocks CLK1A to CLK5A.

The circuit block 342 includes power supply lines 102 and 103. Furthermore, the circuit block 342 includes transistor circuits 321 to 325 and a delay circuit 332. Each of the transistor circuits 321 to 325 includes a clock terminal to which corresponding one of synchronization clocks CLK1B to CLK5B is input. The transistor circuits 321 to 325 are connected between the power supply line 102 and the power supply line 103. Each of the transistor circuits 321 to 325 may include a flip-flop that operates in accordance with corresponding one of the synchronization clocks CLK1B to CLK5B.

The delay circuit 331 generates the synchronization clocks CLK1A to CLK5A on the basis of a reference clock CLK. The delay circuit 332 generates the synchronization clocks CLK1B to CLK5B on the basis of the reference clock CLK. At this time, the delay circuits 331 and 332 set delay times of the synchronization clocks CLK1A to CLK5A and CLK1B to CLK5B from the reference clock CLK such that the operating current of the circuit block 341 is reused as the operating current of the circuit block 342. The delay circuit 331 includes a plurality of buffers 351 connected in cascade. The delay circuit 332 includes a plurality of buffers 352 connected in cascade. Here, the delay time of each of the synchronization clocks CLK1A to CLK5A from the reference clock CLK can be set by changing the number of the buffers 351 from which corresponding one of the synchronization clocks CLK1A to CLK5A is extracted. Furthermore, the delay time of each of the synchronization clocks CLK1B to CLK5B from the reference clock CLK can be set by changing the number of the buffers 352 from which corresponding one of the synchronization clocks CLK1B to CLK5B is extracted. Note that, in a case where the circuit scale of the supply destinations of the synchronization clocks CLK1A to CLK5A and CLK1B to CLK5B is large, buffers for supplying the synchronization clocks CLK1A to CLK5A and CLK1B to CLK5B may be parallelized.

The digital circuit may include not only the inverter chain of the first embodiment described above but also a synchronization circuit using a flip-flop and a combinational logic circuit formed using an AND circuit, an OR circuit, and the like. Here, in the digital circuit, large switching noise is likely to occur particularly at the time of operation of the flip-flop to which the synchronous clock is supplied.

Therefore, the delay times of the synchronization clocks CLK1A to CLK5A and CLK1B to CLK5B may be set on the basis of the relationship between the clock tree delay time and the number of flip-flops. Note that the clock tree is a clock path from the reference clock CLK to the flip-flop. For example, it is assumed that the numbers of flip-flops of the transistor circuits 311 to 315 of the circuit block 341 are 7000, 16000, 18000, 12000, and 3500, respectively. Here, it is assumed that the relationship between the clock tree delay time of the circuit block 341 and the number of flip-flops is given as illustrated in FIG. 8. At this time, the delay times of the synchronization clocks CLK1A to CLK5A can be set to 4.3 ns, 4.5 ns, 4.6 ns, 4.7 ns, and 5.1 ns, respectively.

Also for each of the transistor circuits 321 to 325 of the circuit block 342, the delay time of the corresponding one of the synchronization clocks CLK1B to CLK5B can be set on the basis of the relationship between the clock tree delay time of the circuit block 342 and the number of flip-flops.

As described above, in the third embodiment described above, the delay circuit 331 that generates the synchronization clocks CLK1A to CLK5A and the delay circuit 332 that generates the synchronization clocks CLK1B to CLK5B are provided. As a result, even when the configurations of the circuit blocks 341 and 342 are different from each other, the operating current of the circuit block 341 can be reused as the operating current of the circuit block 342, and the IR drop can be reduced.

4. Fourth Embodiment

In the first embodiment described above, the transistor circuit 111 in which the positive power supply voltage VDDP is used as a power supply and the transistor circuit 112 in which the negative power supply voltage VDDN is used as a power supply are provided. In this fourth embodiment, a transistor circuit in which a positive power supply voltage is used as a power supply and a transistor circuit in which a negative power supply voltage is used as a power supply are applied to a parallel processing circuit.

Figure 9:
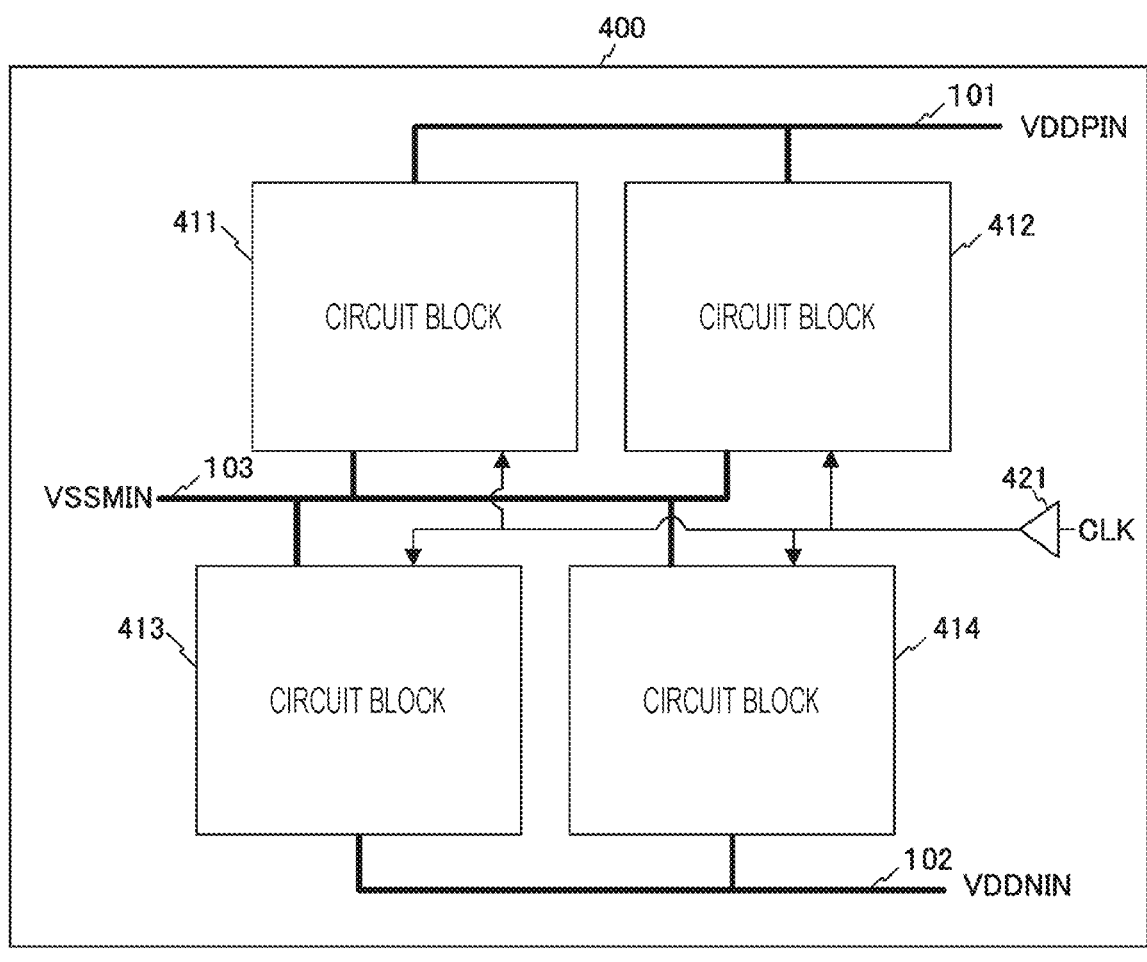
FIG. 9 is a block diagram illustrating a configuration example of an electronic circuit according to a fourth embodiment.

FIG. 9 is a block diagram illustrating a configuration example of an electronic circuit according to the fourth embodiment.

In the figure, an electronic circuit 400 includes circuit blocks 411 and 412 as the transistor circuit 111 of the first embodiment described above, and circuit blocks 413 and 414 as the transistor circuit 112 of the first embodiment described above. Furthermore, in the electronic circuit 400, a buffer 421 is added to the electronic circuit 100 of the first embodiment described above. Other than the buffer 421, components of the electronic circuit 400 of the fourth embodiment are similar to the components of the electronic circuit 100 of the first embodiment described above.

The circuit blocks 411 to 414 can have the same circuit configuration. The circuit blocks 411 to 414 may be, for example, memory banks. The circuit blocks 411 to 414 may be used for a light detection and ranging (LiDAR) sensor such as an indirect time of flight (iToF) sensor. A reference clock CLK is input to the circuit blocks 411 to 414 via the buffer 421. Here, the circuit blocks 411 to 414 can operate in parallel at the same timing in accordance with the reference clock CLK. In this case, the current supplied to each of the circuit blocks 411 and 412 via a power supply line 101 is reused in each of the circuit blocks 413 and 414 and discharged via a power supply line 102.

As described above, in the fourth embodiment described above, the positive power supply voltage VDDPIN is used as a power supply of each of the circuit blocks 411 and 412, and the negative power supply voltage VDDNIN is used as a power supply of each of the circuit blocks 413 and 414. As a result, the current supplied to each of the circuit blocks 411 and 412 can be reused in each of the circuit blocks 413 and 414, and the current flowing through the power supply line 103 can be 0. Therefore, the IR drop of the electronic circuit 400 can be reduced, and the power consumption can be reduced.

5. Fifth Embodiment

In the first embodiment described above, the transistor circuit 111 in which the positive power supply voltage VDDP is used as a power supply and the transistor circuit 112 in which the negative power supply voltage VDDN is used as a power supply are provided. This fifth embodiment is provided with a level shifter that shifts a level of a signal transferred between a transistor circuit in which a positive power supply voltage VDDP is used as a power supply and a transistor circuit in which a negative power supply voltage VDDN is used as a power supply.

Figure 10:
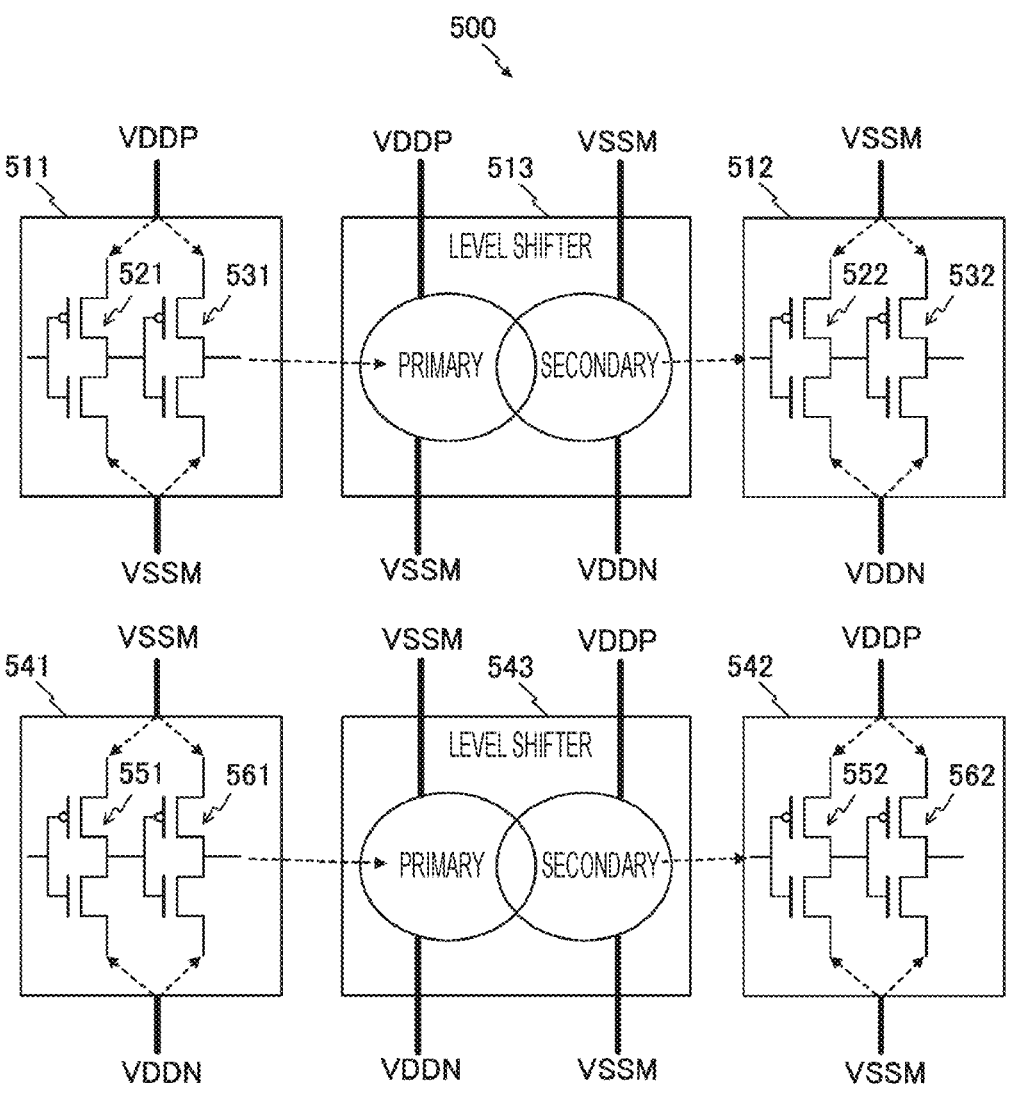
FIG. 10 is a block diagram illustrating a configuration example of an electronic circuit according to a fifth embodiment.

FIG. 10 is a block diagram illustrating a configuration example of an electronic circuit according to the fifth embodiment.

In the figure, an electronic circuit 500 includes a primary transistor circuit 511 and a secondary transistor circuit 542 as the transistor circuit 111 of the first embodiment described above. Furthermore, the electronic circuit 500 includes a primary transistor circuit 541 and a secondary transistor circuit 512 as the transistor circuit 112 of the first embodiment described above. Furthermore, In the electronic circuit 500, level shifters 513 and 543 are added to the electronic circuit 100 of the first embodiment described above. Other than the level shifters, components of the electronic circuit 500 of the fifth embodiment are similar to those of the electronic circuit 100 of the first embodiment described above.

The primary transistor circuit 511 includes inverters 521 and 531. The secondary transistor circuit 512 includes inverters 522 and 532. The primary transistor circuit 541 includes inverters 551 and 561. The secondary transistor circuit 542 includes inverters 552 and 562.

The level shifter 513 shifts a level of a signal transferred between the primary transistor circuit 511 and the secondary transistor circuit 512. On the primary side of the level shifter 513, the positive power supply voltage VDDP and the intermediate voltage VSSM are used as power supplies. On the secondary side of the level shifter 513, the negative power supply voltage VDDN and the intermediate voltage VSSM are used as power supplies. On the primary side of the level shifter 543, the negative power supply voltage VDDN and the intermediate voltage VSSM are used as power supplies. On the secondary side of the level shifter 513, the positive power supply voltage VDDP and the intermediate voltage VSSM are used as power supplies.

The level shifter 543 shifts a level of a signal transferred between the primary transistor circuit 541 and the secondary transistor circuit 542. A signal between the positive power supply voltage VDDP and the intermediate voltage VSSM is input to the primary side of the level shifter 513 from the primary transistor circuit 511. Then, on the secondary side of the level shifter 513, a signal between the positive power supply voltage VDDP and the intermediate voltage VSSM is converted into a signal between the negative power supply voltage VDDN and the intermediate voltage VSSM, and is output to the secondary transistor circuit 512.

Furthermore, a signal between the negative power supply voltage VDDN and the intermediate voltage VSSM is input to the primary side of the level shifter 543 from the primary transistor circuit 541. Then, on the secondary side of the level shifter 543, a signal between the negative power supply voltage VDDN and the intermediate voltage VSSM is converted into a signal between the positive power supply voltage VDDP and the intermediate voltage VSSM, and is output to the secondary transistor circuit 542.

As described above, in the above-described fifth embodiment, the level shifter 513 is provided between the primary transistor circuit 511 and the secondary transistor circuit 512, and the level shifter 543 is provided between the primary transistor circuit 541 and the secondary transistor circuit 542. As a result, even when the positive power supply voltage VDDP and the negative power supply voltage VDDN are used for the electronic circuit 500, signals can be exchanged between the primary transistor circuit 511 and the secondary transistor circuit 512, and signals can be exchanged between the primary transistor circuit 541 and the secondary transistor circuit 542.

6. Sixth Embodiment

In the first embodiment described above, the transistor circuit 111 in which the positive power supply voltage VDDP is used as a power supply and the transistor circuit 112 in which the negative power supply voltage VDDN is used as a power supply are provided. In this sixth embodiment, the power supply line to which the positive power supply voltage VDDP is applied and the power supply line to which the negative power supply voltage VDDN is applied are arranged adjacent to and close to each other on the power plane to which the intermediate voltage VSSM is applied.

Figure 11A:
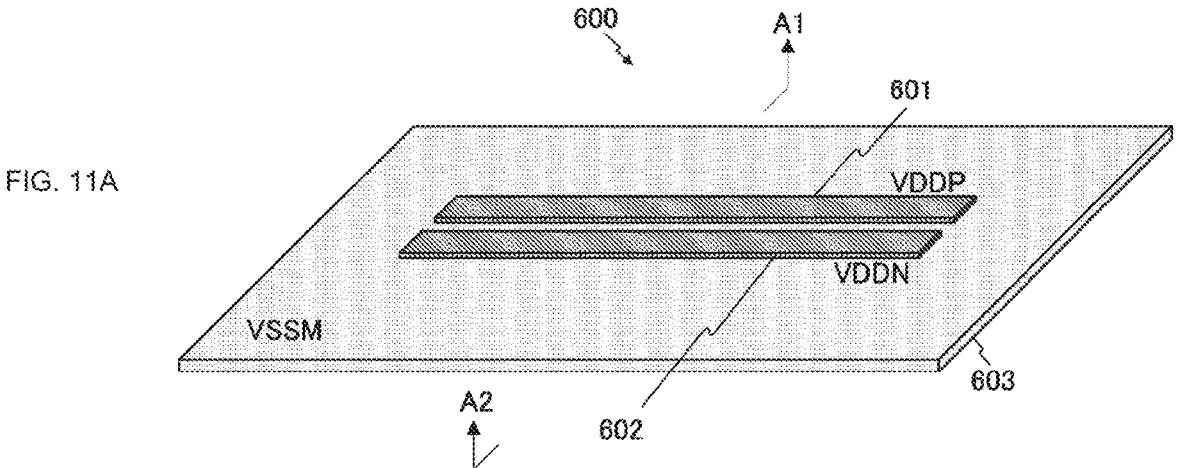
FIGS. 11A and 11B are diagrams illustrating a configuration example of a printed circuit board used for an electronic circuit according to a sixth embodiment.
Figure 11B:
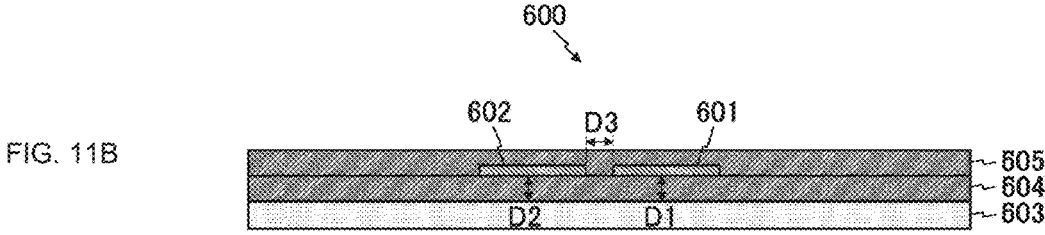

FIGS. 11A and 11B are diagrams illustrating a configuration example of a printed circuit board used for an electronic circuit according to the sixth embodiment. Note that FIG. 11A is a perspective view illustrating a configuration example of a printed circuit board 600 used for an electronic circuit, and FIG. 11B is a cross-sectional view illustrating the configuration example of the printed circuit board 600 used for the electronic circuit. In FIG. 11B, a cross-sectional view along line A1-A2 in FIG. 11A is illustrated.

In the figure, a package in which a semiconductor chip on which the electronic circuit 100 of the above-described first embodiment is formed is implemented can be arranged on the printed circuit board 600. The printed circuit board 600 includes power supply lines 601 and 602 and a power plane 603.

On the power plane 603, the power supply lines 601 and 602 are arranged adjacent to each other via an insulating film 604. On the insulating film 604, an insulating film 605 that covers the power supply lines 601 and 602 is formed. The material of the power supply lines 601 and 602 and the power plane 603 is, for example, a metal such as Al or Cu. The material of the insulating films 604 and 605 may be, for example, an inorganic film of, for example, $SiO_2$ or an organic film of, for example, a solder resist. Note that each of the power supply lines 601 and 602 may include printed wiring or bonding wires.

The positive power supply voltage VDDP is applied to the power supply line 601. The negative power supply voltage VDDN is applied to the power supply line 602. The intermediate voltage VSSM is applied to the power plane 603.

Each of the power supply lines 601 and 602 can be electrically connected to the power supply lines 101 and 102 of the first embodiment described above. The power plane 603 can be electrically connected to the power supply line 103 of the first embodiment described above.

Note that a forward current flows through the power supply line 601, and a return current flows through the power supply line 602. Therefore, it is preferable that the power supply line 601 and the power supply line 602 be arranged adjacent to and close to each other to enhance electromagnetic coupling between the power supply line 601 and the power supply line 602. In this case, an interval D3 between the power supply lines 601 and 602 is preferably 100 μm or less.

Furthermore, when an unbalanced current flows through the power supply line 601 and the power supply line 602, it is necessary to secure a reference potential that causes a return current to flow with respect to the unbalanced current. For this reason, it is preferable to arrange the power plane 603 close to the power supply lines 601 and 602 to strengthen the electromagnetic coupling of the power plane 603 to each of the power supply lines 601 and 602. In this case, the intervals D1 and D2 between the respective power supply lines 601 and 602 and the power plane 603 are preferably 100 μm or less.

Figure 12A:
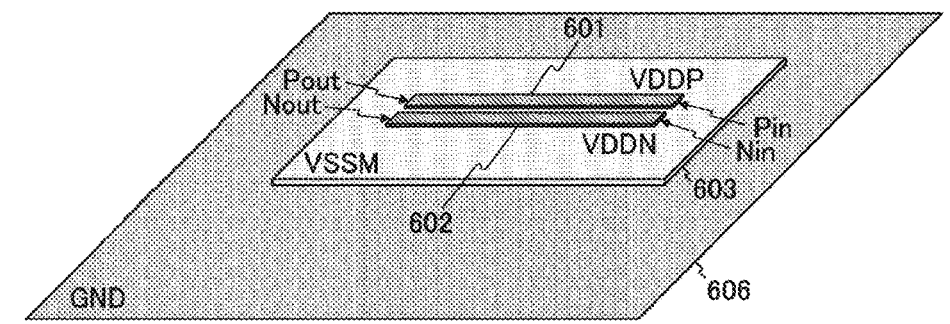
FIGS. 12A, 12B, 12C, and 12D are diagrams illustrating an example of an electromagnetic field analysis model of a printed circuit board used in an electronic circuit according to the sixth embodiment.
Figure 12B:
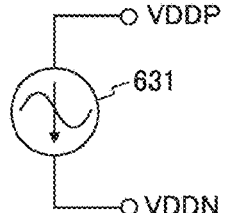
Figure 12C:
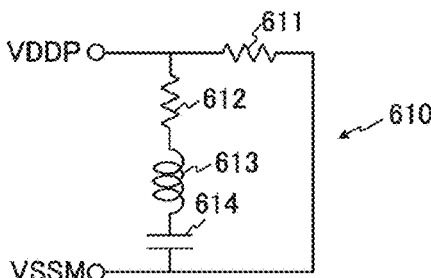
Figure 12D:
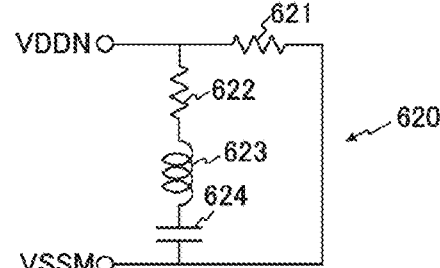

FIGS. 12A, 12B, 12C, and 12D are diagrams illustrating an example of an electromagnetic field analysis model of a printed circuit board used in an electronic circuit according to the sixth embodiment. Note that FIG. 12A is a perspective view illustrating an example of an electromagnetic field analysis model of the printed circuit board 600. FIG. 12B is a diagram illustrating an equivalent circuit of a current source of the electromagnetic field analysis model, FIG. 12C is a diagram illustrating an equivalent circuit of the power supply line 601 to which the positive power supply voltage VDDP is applied, and FIG. 12D is a diagram illustrating an equivalent circuit of the power supply line 602 to which the negative power supply voltage VDDN is applied.

In FIG. 12A, in the electromagnetic field analysis model of the printed circuit board 600 of the sixth embodiment described above, a two-layer substrate on which the power supply lines 601 and 602, and the power plane 603 are formed was mounted at a position separated from the ground plane 606 by 20 cm. Each of the power supply lines 601 and 602 were formed to have a width of 8 mm and a length of several cm. The area of the power plane 603 was made sufficiently larger than the area of each of the power supply lines 601 and 602. The interval between the power supply line 601 and the power supply line 602 was made 100 μm.

In this electromagnetic field analysis model, a current source 631 was connected between the power supply line 601 and the power supply line 602 as illustrated in FIG. 12B. At this time, the current of the current source 631 was set to 0.5 A.

Furthermore, as illustrated in FIG. 12C, in this electromagnetic field analysis model, the power supply line 601 and the power plane 603 are equivalently illustrated as a parallel circuit of a series circuit including a resistor 612, an inductor 613, and a capacitor 614, and a resistor 611. Furthermore, as illustrated in FIG. 12D, in this electromagnetic field analysis model, the power supply line 602 and the power plane 603 are equivalently illustrated as a parallel circuit of a series circuit including a resistor 622, an inductor 623, and a capacitor 624, and a resistor 621.

FIGS. 13A, 13B, and 13C are diagrams illustrating an example of an electromagnetic field analysis model of a comparative example used for comparing EMI with a printed circuit board used for an electronic circuit according to the sixth embodiment. Note that FIG. 13A is a perspective view illustrating an example of an electromagnetic field analysis model of a comparative example used to compare EMI with the printed circuit board 600 used in the electronic circuit. FIG. 13B is a diagram illustrating an equivalent circuit of a current source of the electromagnetic field analysis model of the comparative example, and FIG. 13C is a diagram illustrating an equivalent circuit of a power supply line 641 of the electromagnetic field analysis model of the comparative example.

In FIG. 13A, in the electromagnetic field analysis model of the comparative example of the printed circuit board 600 of the sixth embodiment described above, the two-layer substrate on which the power supply line 641 and a power plane 643 are formed was mounted at a position separated from the ground plane 606 by 20 cm. The width of the power supply line 641 was 8 mm and the length thereof was several cm. The area of the power plane 643 was made sufficiently larger than the area of the power supply line 641.

In this electromagnetic field analysis model, as illustrated in FIG. 13B, a current source 661 was connected between the power supply line 641 and the power plane 643. At this time, the current of the current source 661 was set to 1 A.

Furthermore, as illustrated in FIG. 13C, in this electromagnetic field analysis model, the power supply line 641 and the power plane 643 are equivalently illustrated as a parallel circuit of a series circuit including a resistor 652, an inductor 653, and a capacitor 654, and a resistor 651.

For the printed circuit board 600 and the electromagnetic field analysis model of the comparative example of the printed circuit board 600, a vertically polarized electric field as EMI at a distance of 3 m at 1 GHz and a common mode current traveling in the substrate longitudinal direction at the substrate central portion were obtained by simulation.

As a result, the EMI was simulated to be 61.3 (dBμV/m) for the electromagnetic field analysis model of the printed circuit board 600, and the EMI was simulated to be 83.4 (dBμV/m) for the electromagnetic field analysis model of the comparative example of the printed circuit board 600. Furthermore, the common mode current was simulated to be 13.6 (dBuA) for the electromagnetic field analysis model of the printed circuit board 600, and was simulated to be 41.0 (dBuA) for the electromagnetic field analysis model of the comparative example of the printed circuit board 600. Therefore, it has been confirmed that both the EMI and the common mode current can be reduced several tens of times in the printed circuit board 600 of the sixth embodiment described above as compared with the comparative example. The current of the current source 631 is ½ (=−6 dB) compared with the current of the current source 661, but a reduction effect better than that was provided. This is because, in addition to reduction of excitation due to current flowing into the power plane 603, the power supply lines 601 and 602 behave like differential lines, and common mode coupling paths via stray capacitances from the power supply lines 601 and 602 to the ground plane 606 can also be reduced.

As described above, in the sixth embodiment described above, the power supply lines 601 and 602 are arranged adjacent to and close to each other, and the power plane 603 is arranged close to each of the power supply lines 601 and 602. As a result, EMI and a common mode current can be reduced as compared with the case where the positive power supply voltage is used as the power supply of the transistor circuit.

7. Seventh Embodiment

In the first embodiment described above, the transistor circuit 111 in which the positive power supply voltage VDDP is used as a power supply and the transistor circuit 112 in which the negative power supply voltage VDDN is used as a power supply are provided. In this seventh embodiment, a regulator is provided inside the electronic circuit to generate a negative power supply voltage VDDN.

FIGS. 14A, 14B, and 14C are block diagrams illustrating a configuration example of an electronic circuit according to the seventh embodiment. Note that FIG. 14A illustrates a configuration example in which the positive power supply voltage VDDP and the negative power supply voltage VDDN are supplied from the outside. FIG. 14B illustrates a configuration example in which the negative power supply voltage VDDN is generated on the basis of the positive power supply voltage VDDP. FIG. 14C illustrates a configuration example in which the positive power supply voltage VDDP and the negative power supply voltage VDDN are generated on the basis of a positive power supply voltage VDDH.

In FIG. 14A, an electronic circuit 700 can be configured similarly to the electronic circuit 100 of the first embodiment described above. In this case, in the electronic circuit 700, the positive power supply voltage VDDP is externally applied to a power supply line 101, the negative power supply voltage VDDN is externally applied to a power supply line 102, and an intermediate voltage VSSM is externally applied to a power supply line 103.

In FIG. 14B, an electronic circuit 710 includes a regulator 711 in addition to the electronic circuit 100 of the first embodiment described above. The regulator 711 is connected between the power supply line 101 and the power supply line 103. The positive power supply voltage VDDP is externally applied to the power supply line 101. The intermediate voltage VSSM is externally applied to the power supply line 103. Then, the regulator 711 generates the negative power supply voltage VDDN on the basis of the positive power supply voltage VDDP, and supplies the negative power supply voltage VDDN to the power supply line 102.

In FIG. 14C, an electronic circuit 720 includes a regulator 721 in addition to the electronic circuit 100 of the first embodiment described above. The regulator 721 is connected between a power supply line 104 and the power supply line 103. To the power supply line 104, the positive power supply voltage VDDH is externally applied to the power supply line 101. The intermediate voltage VSSM is externally applied to the power supply line 103. The positive power supply voltage VDDH is higher than the absolute values of the positive power supply voltage VDDP and the absolute value of the negative power supply voltage VDDN. Then, the regulator 721 generates the positive power supply voltage VDDP and the negative power supply voltage VDDN on the basis of the positive power supply voltage VDDH, and supplies the generated voltages to the power supply lines 101 and 102, respectively.

As described above, in the seventh embodiment described above, in order to generate the negative power supply voltage VDDN, the regulator 711 is provided inside the electronic circuit 710, and the regulator 721 is provided inside the electronic circuit 720. As a result, it is not necessary to supply the negative power supply voltage VDDN from the outside, so that the electronic circuits 710 and 720 can be used even in an environment where the negative power supply voltage VDDN cannot be obtained from the outside.

Note that terminals may be appropriately provided in the electronic circuits 710 and 720, and the power supply generated by the respective regulators 711 and 721 may be supplied to stabilization capacitors outside the electronic circuits 710 and 720 to stabilize the power supply voltage.

8. Eighth Embodiment

In the first embodiment described above, the transistor circuit 111 in which the positive power supply voltage VDDP is used as a power supply and the transistor circuit 112 in which the negative power supply voltage VDDN is used as a power supply are provided. In this eighth embodiment, the intermediate voltage VSSM between the positive power supply voltage VDDP and the negative power supply voltage VDDN is set to a voltage higher than the substrate voltage.

Figure 15:
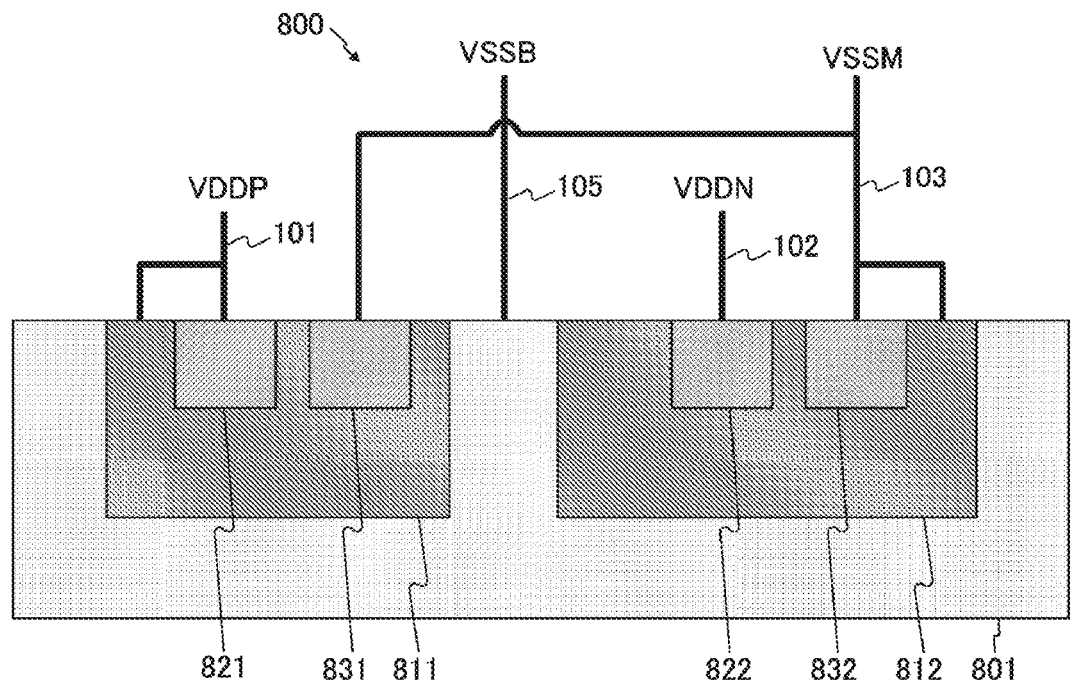
FIG. 15 is a cross-sectional view illustrating a configuration example of an electronic circuit according to an eighth embodiment.

FIG. 15 is a cross-sectional view illustrating a configuration example of an electronic circuit according to the eighth embodiment.

In the figure, an electronic circuit 800 includes a P-type semiconductor substrate 801. A deep N-well vertical structure can be formed in the P-type semiconductor substrate 801. In this case, in the P-type semiconductor substrate 801, N-wells 811 and 812 are separately formed. In the N-well 811, an N-well 821 and a P-well 831 are separately formed. In the N-well 812, an N-well 832 and a P-well 822 are separately formed.

In the N-well 821, a P-channel field effect transistor included in the transistor circuit 111 of the first embodiment described above can be formed. In the P-well 831, an N-channel field effect transistor included in the transistor circuit 111 of the first embodiment described above can be formed.

In the N-well 832, a P-channel field effect transistor included in the transistor circuit 112 of the first embodiment described above can be formed. In the P-well 822, an N-channel field effect transistor included in the transistor circuit 112 of the first embodiment described above can be formed.

A power supply line 101 is connected to the N-wells 811 and 821. A power supply line 102 is connected to the P-well 822. The power supply line 103 is connected to the N-wells 812 and 832 and the P-well 831. A power supply line 105 is connected to the P-type semiconductor substrate 801. A substrate voltage VSSB is applied to the power supply line 105.

Here, when the operating current flows, the substrate potential or the well potential of the P-type semiconductor substrate 801 rises. Therefore, when the intermediate voltage VSSM is set to 0 V and the substrate voltage VSSB is also set to 0 V, a leakage current flows between the N-wells 812 and 832 and the P-type semiconductor substrate 801, which may affect the characteristics of the electronic circuit 800.

In order to prevent leakage current between the N-wells 812 and 832 and the P-type semiconductor substrate 801, the intermediate voltage VSSM may be set higher than the substrate voltage VSSB. For example, when the substrate voltage VSSB is set to 0 V, the intermediate voltage VSSM may be set to 0.2 V or 0.3 V. Alternatively, when the intermediate voltage VSSM is set to 0 V, the substrate voltage VSSB may be set to −0.2 V or −0.3 V.

As described above, according to the eighth embodiment described above, setting of the intermediate voltage VSSM higher than the substrate voltage VSSB can prevent a leakage current from flowing between the N-wells 812 and 832 and the P-type semiconductor substrate 801.

Note that the embodiments described above provide examples for embodying the present technology, and the matters in the embodiments have corresponding relationships with the respective matters specifying the invention in the claims. Similarly, the matters specifying the invention in the claims and the respective matters having the same names in the embodiments of the present technology have corresponding relationships. However, the present technology is not limited to the embodiments, and can be embodied by variously modifying the embodiments without departing from the gist of the present technology. Note that effects described in the present specification are merely examples and are not limited, and other effects may be provided.

Note that the present technology may also have the following configurations.

(1) An electronic circuit including:

a first power supply line to which a positive power supply voltage is applied;

a second power supply line to which a negative power supply voltage is applied;

a third power supply line to which an intermediate voltage between the positive power supply voltage and the negative power supply voltage is applied;

a first transistor circuit connected between the first power supply line and the third power supply line; and a second transistor circuit connected between the second power supply line and the third power supply line.

(2) The electronic circuit according to (1), in which the first transistor circuit includes a first parasitic capacitance between the first transistor circuit and the third power supply line, and the second transistor circuit includes a second parasitic capacitance between the second transistor circuit and the third power supply line.

(3) The electronic circuit according to (1) or (2), in which the first power supply line is used as a current supply source of the first transistor circuit, the second power supply line is used as a current discharge source of the second transistor circuit, and the third power supply line is used as a current discharge source of the first transistor circuit and is used as a current supply source of the second transistor circuit.

(4) The electronic circuit according to any one of (1) to (3), in which the intermediate voltage is set to a ground voltage.

(5) The electronic circuit according to any one of (1) to (4), further including:

a P-type semiconductor substrate;

a first N-well formed in the P-type semiconductor substrate and connected to the first power supply line;

a second N-well formed in the P-type semiconductor substrate and connected to the third power supply line;

a third N-well formed in the first N-well and connected to the first power supply line;

a first P-well formed in the first N-well and connected to the third power supply line;

a fourth N-well formed in the second N-well and connected to the third power supply line; and a second P-well formed in the second N-well and connected to the second power supply line, in which the first transistor circuit includes:

a first P-channel field effect transistor formed in the third N-well; and a first N-channel field effect transistor formed in the first P-well, and the second transistor circuit includes:

a second P-channel field effect transistor formed in the fourth N-well; and a second N-channel field effect transistor formed in the second P-well.

(6) The electronic circuit according to (5), in which the intermediate voltage is set to a voltage higher than a substrate voltage of the P-type semiconductor substrate.

(7) The electronic circuit according to any one of (1) to (6), in which the first transistor circuit and the second transistor circuit are buffers.

(8) The electronic circuit according to (7), in which the buffers are multi-stage buffers.

(9) The electronic circuit according to any one of (1) to (8), in which each of the first transistor circuit and the second transistor circuit includes a digital circuit and an analog circuit, and the electronic circuit further includes a power plane shared by the digital circuit and the analog circuit and to which the intermediate voltage is applied.

(10) The electronic circuit according to any one of (1) to (9), in which an operation of the first transistor circuit and an operation of the second transistor circuit are synchronized.

(11) The electronic circuit according to any one of (1) to (10), further including a delay circuit that brings an operation timing of the first transistor circuit and an operation timing of the second transistor circuit closer to each other.

(12) The electronic circuit according to any one of (1) to (11), further including a level shifter that shifts a level of a signal transferred between the first transistor circuit and the second transistor circuit.

(13) The electronic circuit according to any one of (1) to (12), further including a regulator that generates the negative power supply voltage on the basis of the positive power supply voltage.

(14) The electronic circuit according to any one of (1) to (13), further comprising:

a substrate on which a power plane to which the intermediate voltage is applied is formed; and a fourth power supply line to which the positive power supply voltage is applied and a fifth power supply line to which the negative power supply voltage is applied, the fourth power supply line and the fifth power supply line being arranged adjacent to each other via an insulating film on the power plane.

REFERENCE SIGNS LIST

100 to 500, 700, 710, 720 Electronic circuit
101 to 103, 601, 602 Power supply line
111, 112 Transistor circuit
121 to 123 Resistor
131 to 135, 151 to 155 Inverter
142 to 145, 162 to 165 Capacitor
201 Analog circuit
202 Digital circuit
331, 332 Delay circuit
351, 352, 421 Buffer
513, 543 Level shifter 600 Printed circuit board
711, 721 Regulator
801 P-type semiconductor substrate
811, 812, 821, 832 N-well
822, 831 P-well

The invention claimed is:

1. An electronic circuit, comprising:
a first power supply line configured to receive a positive power supply voltage;
a second power supply line configured to receive a negative power supply voltage;
a third power supply line configured to receive an intermediate voltage, wherein the intermediate voltage is between the positive power supply voltage and the negative power supply voltage;
a first transistor circuit connected between the first power supply line and the third power supply line; and
a second transistor circuit connected between the second power supply line and the third power supply line, wherein an operation of the first transistor circuit is in synchronization with an operation of the second transistor circuit.

2. The electronic circuit according to claim 1, wherein the first transistor circuit includes a first parasitic capacitance,
the first parasitic capacitance is between the first transistor circuit and the third power supply line,
the second transistor circuit includes a second parasitic capacitance, and
the second parasitic capacitance is between the second transistor circuit and the third power supply line.

3. The electronic circuit according to claim 1, wherein the first power supply line is a current supply source of the first transistor circuit,
the second power supply line is a current discharge source of the second transistor circuit, and
the third power supply line is each of a current discharge source of the first transistor circuit and a current supply source of the second transistor circuit.

4. The electronic circuit according to claim 1, wherein the intermediate voltage is a ground voltage.

5. The electronic circuit according to claim 1, further comprising:
a P-type semiconductor substrate;
a first N-well in the P-type semiconductor substrate, wherein the first N-well is connected to the first power supply line;
a second N-well in the P-type semiconductor substrate, wherein the second N-well is connected to the third power supply line;
a third N-well in the first N-well, wherein the third N-well is connected to the first power supply line;
a first P-well in the first N-well, wherein the first P-well is connected to the third power supply line;
a fourth N-well in the second N-well, wherein the fourth N-well is connected to the third power supply line; and
a second P-well in the second N-well, wherein
the second P-well is connected to the second power supply line, the first transistor circuit includes:
a first P-channel field effect transistor in the third N-well; and
a first N-channel field effect transistor in the first P-well, and
the second transistor circuit includes:
a second P-channel field effect transistor in the fourth N-well; and
a second N-channel field effect transistor in the second P-well.

6. The electronic circuit according to claim 5, wherein the intermediate voltage is greater than a substrate voltage of the P-type semiconductor substrate.

7. The electronic circuit according to claim 1, wherein each of the first transistor circuit and the second transistor circuit is a buffer.

8. The electronic circuit according to claim 7, wherein the buffer is a multi-stage buffer.

9. The electronic circuit according to claim 1, wherein each of the first transistor circuit and the second transistor circuit includes a digital circuit and an analog circuit, and
the electronic circuit further comprises a power plane, the power plane is associated with each of
the digital circuit,
the analog circuit, and
an application of the intermediate voltage.

10. The electronic circuit according to claim 1, further comprising a delay circuit configured to generate a plurality of synchronization clocks such that an operation timing of the first transistor circuit is equal to an operation timing of the second transistor circuit.

11. The electronic circuit according to claim 1, further comprising a level shifter configured to shift a level of a signal that is between the first transistor circuit and the second transistor circuit.

12. The electronic circuit according to claim 1, further comprising a regulator configured to generate the negative power supply voltage based on the positive power supply voltage.

13. The electronic circuit according to claim 1, further comprising:
a substrate that includes a power plane, wherein
the power plane is configured to receive the intermediate voltage, and
the power plane includes an insulating film;
a fourth power supply line configured to receive the positive power supply voltage; and
a fifth power supply line configured to receive the negative power supply voltage, wherein
each of the fourth power supply line and the fifth power supply line is on the power plane,
the fourth power supply line is adjacent to the fifth power supply line, and
the insulating film is between the fourth power supply line and fifth power supply line.

* * * * *